United States Patent
Willmeroth et al.

(10) Patent No.: US 8,803,205 B2
(45) Date of Patent: Aug. 12, 2014

(54) TRANSISTOR WITH CONTROLLABLE COMPENSATION REGIONS

(75) Inventors: Armin Willmeroth, Augsburg (DE); Franz Hirler, Isen (DE); Hans Weber, Bayerisch Gmain (DE); Michael Treu, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/484,490

(22) Filed: May 31, 2012

(65) Prior Publication Data

US 2012/0305993 A1   Dec. 6, 2012

Related U.S. Application Data

(63) Continuation-in-part of application No. 13/118,928, filed on May 31, 2011.

(51) Int. Cl.
*H01L 29/66* (2006.01)

(52) U.S. Cl.
USPC ........... 257/262; 257/335; 257/329; 257/328; 257/357; 257/341; 257/488; 257/77; 257/781; 438/212; 438/270; 438/17

(58) Field of Classification Search
USPC ......... 257/335, 262, 329, 328, 357, 341, 488, 257/77; 438/212, 270, 17
See application file for complete search history.

(56) References Cited

U.S. PATENT DOCUMENTS

| | | | | |
|---|---|---|---|---|
| 4,754,310 A | * | 6/1988 | Coe | 257/287 |
| 5,459,339 A | * | 10/1995 | Sakurai et al. | 257/167 |
| 5,510,641 A | * | 4/1996 | Yee et al. | 257/367 |
| 5,616,945 A | | 4/1997 | Williams | |
| 5,674,766 A | * | 10/1997 | Darwish et al. | 438/270 |
| 5,689,144 A | * | 11/1997 | Williams | 307/130 |
| 5,895,952 A | * | 4/1999 | Darwish et al. | 257/330 |
| 6,649,975 B2 | * | 11/2003 | Baliga | 257/330 |
| 6,803,627 B2 | * | 10/2004 | Pfirsch | 257/341 |
| 6,838,729 B2 | * | 1/2005 | Schlögl et al. | 257/328 |
| 6,853,033 B2 | * | 2/2005 | Liang et al. | 257/339 |
| 7,019,360 B2 | * | 3/2006 | Blanchard et al. | 257/329 |

(Continued)

OTHER PUBLICATIONS

Hirler, F. et al. "Circuit Arrangement with an Adjustable Transistor Component." Co-pending U.S. Appl. No. 13/118,993, filed May 31, 2011.

(Continued)

*Primary Examiner* — Fernando L Toledo
*Assistant Examiner* — Mohammed Shamsuzzaman
(74) *Attorney, Agent, or Firm* — Murphy, Bilak & Homiller, PLLC

(57) ABSTRACT

A semiconductor device includes a gate terminal, at least one control terminal and first and second load terminals and at least one device cell. The at least one device cell includes a MOSFET device having a load path and a control terminal, the control terminal coupled to the gate terminal and a JFET device having a load path and a control terminal, the load path connected in series with the load path of the MOSFET device between the load terminals. The at least one device cell further includes a first coupling transistor having a load path and a control terminal, the load path coupled between the control terminal of the JFET device and one of the source terminal and the gate terminal, and the control terminal coupled to the at least one control terminal of the transistor device.

28 Claims, 18 Drawing Sheets

(56) References Cited

U.S. PATENT DOCUMENTS

| | | |
|---|---|---|
| 7,582,531 B2 | 9/2009 | Siemieniec et al. |
| 7,724,064 B2 * | 5/2010 | Tihanyi et al. ............... 327/374 |
| 7,737,491 B2 * | 6/2010 | Hotta et al. .................. 257/330 |
| 7,750,397 B2 * | 7/2010 | Hirler et al. .................. 257/328 |
| 7,772,668 B2 * | 8/2010 | Pan .............................. 257/492 |
| 7,855,415 B2 * | 12/2010 | Challa et al. ................. 257/341 |
| 7,982,265 B2 * | 7/2011 | Challa et al. ................. 257/341 |
| 8,143,124 B2 * | 3/2012 | Challa et al. ................. 438/270 |
| 2002/0096708 A1 * | 7/2002 | Ahlers et al. ................. 257/328 |
| 2002/0140025 A1 * | 10/2002 | Blanchard .................... 257/328 |
| 2002/0179968 A1 * | 12/2002 | Pfirsch ......................... 257/341 |
| 2002/0185679 A1 * | 12/2002 | Baliga .......................... 257/329 |
| 2003/0006453 A1 * | 1/2003 | Liang et al. .................. 257/328 |
| 2003/0155610 A1 * | 8/2003 | Schlogl et al. ............... 257/335 |
| 2004/0145013 A1 * | 7/2004 | Pfirsch ......................... 257/335 |
| 2006/0076621 A1 * | 4/2006 | Hirler .......................... 257/343 |
| 2006/0097313 A1 * | 5/2006 | Yanagisawa et al. ......... 257/329 |
| 2006/0211189 A1 * | 9/2006 | Siemieniec et al. .......... 438/212 |
| 2006/0238241 A1 * | 10/2006 | Pearce et al. ................. 330/10 |
| 2007/0018716 A1 * | 1/2007 | Tihanyi et al. ............... 327/566 |
| 2007/0187753 A1 * | 8/2007 | Pattanayak et al. .......... 257/330 |
| 2008/0197405 A1 * | 8/2008 | Pfirsch et al. ................ 257/329 |
| 2008/0272429 A1 * | 11/2008 | Ishiguro ....................... 257/330 |
| 2008/0296679 A1 * | 12/2008 | Blanchard .................... 257/342 |
| 2008/0299726 A1 * | 12/2008 | Ninomiya et al. ............ 438/270 |
| 2009/0023260 A9 * | 1/2009 | Blanchard .................... 438/270 |
| 2009/0085103 A1 * | 4/2009 | Hille et al. ................... 257/330 |
| 2010/0044791 A1 * | 2/2010 | Hebert ......................... 257/341 |
| 2010/0304511 A1 * | 12/2010 | Hall et al. .................... 438/17 |
| 2010/0314682 A1 * | 12/2010 | Yilmaz et al. ................ 257/328 |
| 2010/0320536 A1 * | 12/2010 | Schmidt ....................... 257/337 |
| 2011/0073906 A1 * | 3/2011 | Bobde et al. ................. 257/147 |
| 2011/0309810 A1 * | 12/2011 | Willmeroth et al. ......... 323/282 |
| 2012/0049898 A1 * | 3/2012 | Mauder et al. ............... 327/109 |
| 2012/0168856 A1 * | 7/2012 | Luo et al. ..................... 257/330 |
| 2012/0175634 A1 * | 7/2012 | Weis ............................ 257/77 |
| 2012/0187473 A1 * | 7/2012 | Zeng et al. ................... 257/329 |
| 2012/0193748 A1 * | 8/2012 | Yedinak et al. .............. 257/488 |
| 2012/0217540 A1 * | 8/2012 | Hirler .......................... 257/133 |
| 2012/0256254 A1 * | 10/2012 | Huang et al. ................. 257/329 |
| 2012/0305993 A1 * | 12/2012 | Willmeroth et al. ......... 257/262 |
| 2012/0306464 A1 * | 12/2012 | Hirler et al. .................. 323/282 |

OTHER PUBLICATIONS

Mauder, A. "Circuit Arrangement with an Adjustable Transistor Component." Co-pending U.S. Appl. No. 12/873,146, filed Aug. 31, 2010.

* cited by examiner

TRANSISTOR WITH CONTROLLABLE COMPENSATION REGIONS

TECHNICAL FIELD

Embodiments of the present application relate to a transistor, in particular a MOS transistor with a compensation region.

BACKGROUND

MOSFETs (Metal Oxide Semiconductor Field-Effect Transistors), in particular power MOSFETs, are widely used as electronic switches for switching electrical loads or as electronic switches in all types of switching converters. A power MOSFET includes a drain region, a drift region adjoining the drain region, and a source region, each having a first conductivity type, and a body region arranged between the drift region and source region of a second conductivity type. A gate electrode serves to control a conducting channel in the body region between the source region and the drift region. The source electrode is electrically connected to a source electrode which is also connected to the body region, and the drain region is electrically connected to the drain electrode. The MOSFET can be switched on and off by applying a suitable drive potential to the gate terminal.

In a specific type of MOSFET, which is also referred to as compensation or superjunction MOSFET, a compensation region is arranged in the drift region. This compensation region is of the same doping type as the body region and is electrically connected to the body region. The compensation region includes doping charges that are complementary to the doping charges in the drift region and that "compensate" the doping charges in the drift region when the MOSFET is in its off-state. By virtue of the compensation regions the drift region can be more highly doped than in conventional MOSFETs, resulting in a reduced on-resistance, at a given voltage blocking capability.

MOSFETs include a voltage dependent output capacitance (usually referred to as $C_{OSS}$) which usually includes a drain-source capacitance $C_{DS}$ between its drain and source terminals and a gate-drain capacitance $C_{GD}$ between its gate and drain terminals. When the MOSFET transitions from the on-state to the off-state, the output capacitance is charged, i.e. energy is stored in the output capacitance; the output capacitance is discharged, when the MOSFET transitions from the off-state to the on-state. The output energy $E_{OSS}$, which is the energy stored in the output capacitance, is mainly dependent on the voltage across the drain-source path when the MOSFET is in its off-state and is dependent on the capacitance value of the output capacitance. A compensation MOSFET, due to the compensation regions connected to the body regions and the source electrode, has a high drain-source capacitance and, therefore, has a high output capacitance.

Losses occur when a MOSFET is operated. These losses mainly include (a) capacitive losses and (b) ohmic losses.
  (a) The capacitive losses are defined by the energy stored in the output capacitance of the MOSFET, wherein these losses increase with increasing output capacitance. In many applications, the capacitive losses dominate the switching losses under typical load conditions.
  (b) Ohmic losses occur when the MOSFET is in its on-state. Ohmic losses are due to the MOSFET's on-resistance. Additionally, switching losses occur when the MOSFET switches from the on-state to the off-state, and vice versa. These switching losses result from the fact that MOSFETs do not switch on or off abruptly, but they gradually change between the on-state, in which an ohmic resistance of the MOSFET assumes its minimum value, and the off-state, in which the MOSFET blocks and prevents a current flow. The minimum value of the ohmic resistance is the on-resistance.

The ohmic losses are proportional to the square of the load current, while the capacitive losses have a smaller dependency on the load current. Therefore, dependent on the specific load conditions, the ohmic losses or the capacitive losses may prevail. For example, when a load connected to the MOSFET draws a low load current, so that a low current flows through the MOSFET in its on-state, the capacitive losses may mainly determine the overall losses. Whereas, when the load draws a high load current, the ohmic losses and switching losses during transition phases may mainly determine the overall losses. The switching losses during transition phases and the capacitive losses are directly proportional to the switching frequency of the device.

In addition, the output charge $Q_{OSS}$, which is the charge stored in the output capacitance, is important for some applications. E.g. the turn off delay time of the MOSFET at low load currents is dominated by the output charge. This is the charge which has to be stored in the output capacitance before the transistor is completely turned off. This output charge is provided by the load current. Therefore, the turn off delay time increases inversely proportional with decreasing load current.

There is, therefore, a need to provide a MOSFET with a compensation region in which dependent on the load conditions the losses and turn off delay time can be minimized.

SUMMARY

A first aspect relates to a semiconductor device, in particular a MOSFET, including at least one transistor cell. The transistor cell includes a source region, a drain region, a body region and a drift region in a semiconductor body, where the body region is arranged between the source region and the drift region and the drift region is arranged between the body region and the drain region. The transistor cell further includes a compensation region arranged in the drift region, a source electrode electrically contacting the source region and the body region, and a gate electrode arranged adjacent to the body region and dielectrically insulated from the body region by a gate dielectric. A coupling arrangement includes a control terminal and is configured to electrically couple the compensation region to at least one of the body region, the source region, the source electrode and the gate electrode dependent on a control signal received at the control terminal.

A second aspect relates to a semiconductor device, in particular a MOSFET, including at least one transistor cell of a first type and at least one transistor cell of a second type.

The at least one transistor cell of the first type includes a first source region, a first drain region, a first body region and a first drift region, where the first body region is arranged between the first source region and the first drift region and the first drift region is arranged between the first body region and the first drain region. The at least one transistor cell of the first type further includes a first gate electrode arranged adjacent to the first body region and dielectrically insulated from the first body region by a first gate dielectric, a first source electrode electrically contacting the first source region and the first body region, and a first compensation region arranged in the first drift region and electrically connected to at least one of the first body region, the first source region and the first gate electrode.

The at least one transistor cell of the second type includes a second drain region, a second body region and a second drift region, where the second drift region is arranged between the second body region and the second drain region, a second compensation region arranged in the second drift region and distant to the second body region, and a second source electrode electrically contacting the second body region. The at least one transistor cell of the second type further includes a coupling arrangement including a control terminal and being configured to electrically couple the second compensation region to at least one of the second body region and the second source electrode dependent on a control signal received at the control terminal.

A third aspect relates to a semiconductor device including a gate terminal, at least one control terminal and first and second load terminals and including at least one device cell. The at least one device cell includes a MOSFET device having a load path and a control terminal, the control terminal coupled to the gate terminal, a JFET device having a load path and a control terminal, the load path connected in series with the load path of the MOSFET device between the load terminals; a first coupling transistor having a load path and a control terminal, the load path coupled between the control terminal of the JFET device and one of the source terminal and the gate terminal, and the control terminal coupled to the at least one control terminal of the transistor device.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Figure 1:
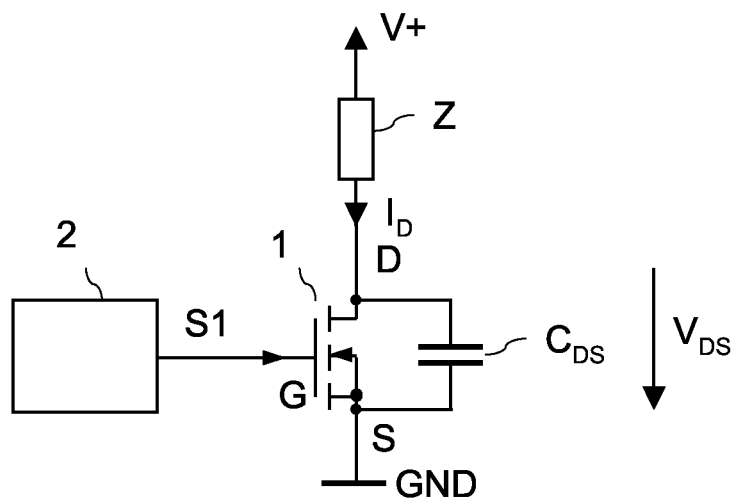
FIG. 1 schematically illustrates the use of a MOSFET as an electronic switch for switching a load.

In order to ease a better understanding of embodiments which will be explained herein further below, the use of a transistor component as an electronic switch will be explained with reference to FIG. 1. FIG. 1 shows a circuit diagram with a transistor component 1 that acts as an electronic switch for switching a current through a load Z. The transistor component 1, which in the example of FIG. 1 is implemented as a MOSFET, includes a gate terminal G which is configured to receive a drive signal 51 from a drive circuit 2, and a load path. The load path, which can also be referred to as internal load path, extends within the transistor 1 between a drain and a source terminal D, S. The load path D-S is connected in series with a load Z, with the series circuit with the transistor 1 and the load Z being connected between terminals for a first and a second supply potential V+, GND. The load Z can be a resistive load such as e.g. a filament bulb, an inductive load such as a coil, a transformer or an induction motor, or a capacitive load.

The transistor 1 can be switched on and off by the drive circuit 2 that generates a suitable drive signal 51 at the gate terminal G of the transistor 1. The drive signal is, for example, a pulsewidth-modulated (PWM) signal. This is commonly known, so that no further explanation is required in this regard.

When the MOSFET is switched on, i.e. when the MOSFET is in an on-state, a load current $I_D$ flows through the load Z and the load path of the transistor 1, where the magnitude of the load current $I_D$ is mainly defined by the supply voltage present between the terminals for the first and second supply potential V+, GND and by the characteristic of the load Z. When the transistor 1 is in the on-state, ohmic losses occur in the transistor 1. These losses result from the on-resistance of the transistor 1 and the load current $I_D$ flowing through the transistor 1. When the MOSFET changes its operation state from the on-state to the off-state, i.e. when the MOSFET is switched off, or changes its operation state from the off-state to the on-state, losses increase for a short time interval. This is high currents and high voltages being present simultaneously at the load terminals D, S of the transistor 1 in transition phases between the on-state and the off-state.

Figure 2:
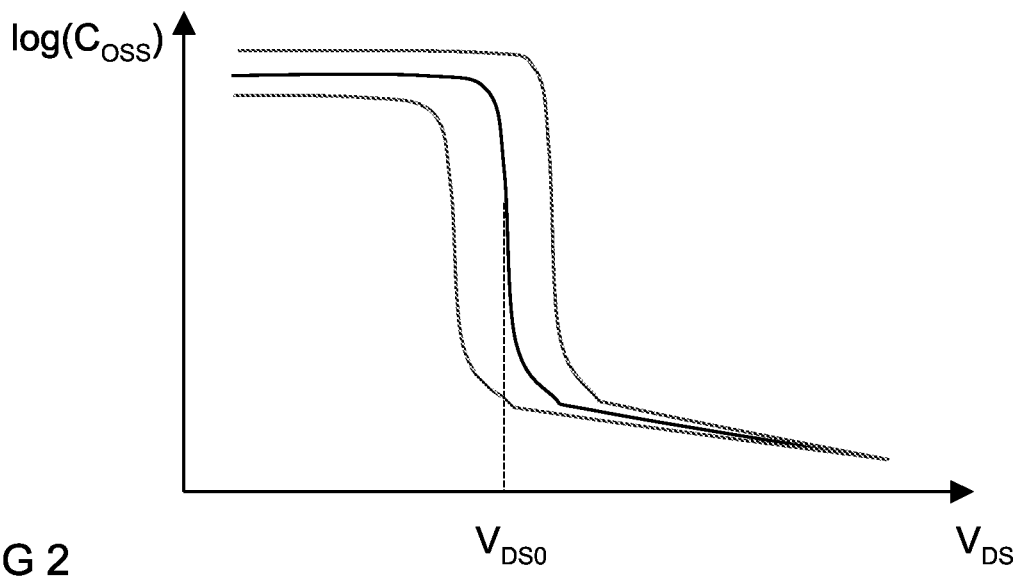
FIG. 2 schematically illustrates the voltage-dependency of an output capacitance of a MOSFET.

Transistor components, in particular MOSFETs, include an output capacitance which is effective between the drain and the source and the drain and the gate terminals and usually includes a drain-source capacitance $C_{DS}$ between the drain and the source terminals D, S and a gate-drain $C_{GD}$ capacitance between the gate and the drain terminal. In FIG. 1 the drain-source $C_{DS}$ capacitance is schematically illustrated. It should be noted in this connection that the drain-source capacitance and the drain-gate capacitance can be regarded to be connected in parallel in a small-signal equivalent circuit diagram, where this parallel circuit forms the output capacitance of the MOSFET. A capacitance value $C_{OSS}$ of the output capacitance is dependent on the voltage between the drain and source terminals D, S of the transistor 1. The dependency of this capacitance value $C_{OSS}$ on the voltage $V_{DS}$ between the drain and source terminals D, S is schematically illustrated in FIG. 2.

When the transistor 1 is switched off and the voltage $V_{DS}$ across the load path of the transistor 1 increases, the output capacitance is charged, i.e. energy is stored in the output capacitance. Equivalently, the output capacitance is discharged when the MOSFET is switched on. Charging the output capacitance when the MOSFET is switched off, and discharging the output capacitance when the MOSFET is switched on causes losses, which will be referred to as capacitive losses in the following.

Losses that occur when the transistor component 1 is operated in a switched-mode, i.e. when the transistor component 1 is cyclically switched on and off, include ohmic losses, switching losses during transition phases, and capacitive losses. Which of these losses prevails is dependent on the load condition of the transistor component 1. The load condition of the transistor component 1 is mainly defined by the load current $I_D$ flowing through the transistor 1 in the on-state, but is also defined by the switching frequency at which the transistor is switched on and off.

The capacitive losses are dependent on the energy which is stored in the output capacitance when the transistor 1 is switched off. This energy is dependent on the capacitance value $C_{OSS}$ of the output capacitance and the maximum voltage across the load path of the transistor 1 when the transistor 1 is in the off-state.

There are transistor components in which the capacitance value $C_{OSS}$ of the output capacitance is dependent on the voltage across the load path of the transistor 1. FIG. 2 schematically illustrates such voltage-dependency of the output capacitance value $C_{OSS}$ on the voltage across the transistor. In FIG. 2, $C_{OSS}$ denotes the output capacitance value, and $V_{DS}$ denotes the voltage between the drain and source terminals D, S of the transistor 1. As can be seen from FIG. 2, there is a voltage $V_{DS0}$ at which the output capacitance value $C_{OSS}$ significantly decreases when the voltage $V_{DS}$ increases.

In FIG. 2, besides the curve in which the output capacitance value $C_{OSS}$ rapidly decreases at $V_{DS0}$, two further curves are shown in which the capacitance value rapidly decreases at a voltage higher than $V_{DS0}$ and rapidly decreases at a voltage lower than $V_{DS0}$, respectively. The $V_{DS0}$ voltage can be dependent on the maximum capacitance value, which occurs at low drain-source voltages $V_{DS}$. According to one embodiment, the $V_{DS0}$ voltage decreases with decreasing maximum capacitance value $C_{OSS}$.

The energy $E_{OSS}$ stored in the output capacitance is given by:

$$E_{OSS} = \int_{V_{DSon}}^{V_{DSoff}} C_{OSS}(V_{DS}) V_{DS} \, dV_{DS} \qquad \text{1a)}$$

where $V_{DSon}$ is the voltage across the load path when the transistor 1 is in the on-state, and $V_{DSoff}$ is the voltage across the load path when the transistor 1 is in the off-state. $C_{OSS}$ ($V_{DS}$) is the output capacitance value which is dependent on the voltage $V_{DS}$. Since the voltage $V_{DSon}$ across the transistor 1 in the on-state is, usually, very low and significantly lower than the voltage $V_{DSoff}$ in the off-state, equation (1a) can be simplified to $$E_{OSS} = \int_0^{V_{DSoff}} C_{OSS}(V_{DS})V_{DS}\, dV_{DS}. \tag{1b}$$

It can be seen from FIG. 2 and from equations (1a) or (1b), respectively, that the energy $E_{OSS}$ stored in the output capacitance and, therefore, the capacitive losses can be reduced by decreasing the voltage value $V_{DS0}$ at which the output capacitance value $C_{OSS}$ decreases as well as by reducing the plateau-value, i.e. the maximum capacitance value, at low $V_{DS}$.

A first embodiment of a transistor component 10 which has a voltage-dependent output capacitance and in which the voltage-dependency of the output capacitance can be adjusted is explained next with reference to FIG. 3.

Figure 3:
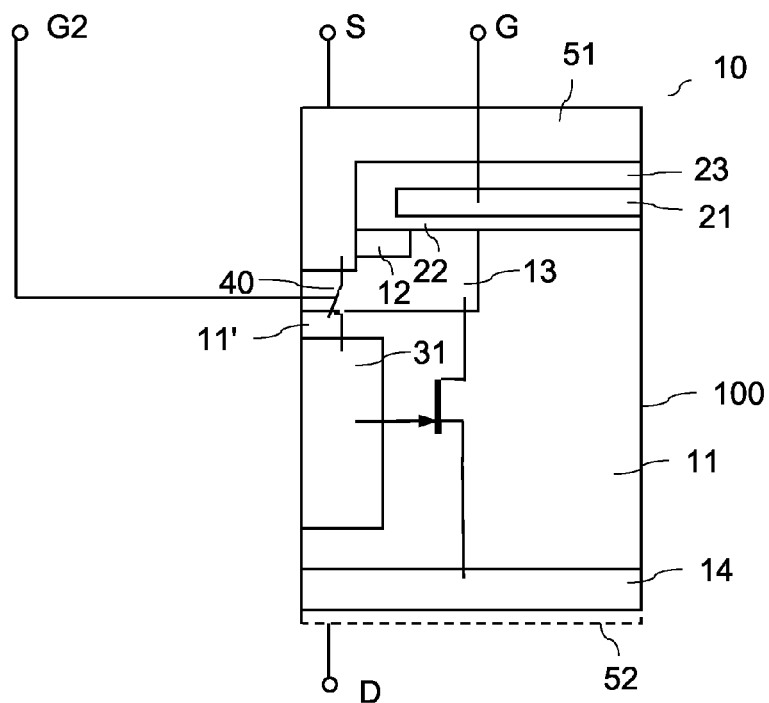
FIG. 3 schematically illustrates a vertical cross sectional view of a MOSFET including a coupling arrangement connected between a compensation region and a source electrode.

The transistor component 10 illustrated in FIG. 3 is implemented as a MOSFET, specifically as a compensation or superjunction MOSFET. The characteristic curve of the output capacitance $C_{OSS}$ illustrated in FIG. 2 in which there is a strong dependency of the output capacitance $C_{OSS}$ on the drain-source voltage $V_{DS}$ is typical for a superjunction MOSFET. Referring to FIG. 3, the MOSFET includes a source region 12 connected to a source electrode 51 forming a source terminal S, and a drain region 14 connected to a drain terminal D. The drain terminal D may be formed by a drain electrode 52 arranged on the drain region 14. The MOSFET further includes a drift region 11 and a body region 13, where the body region 13 is arranged between the source region 12 and the drift region 11, and the drift region 11 is arranged between the body region 13 and the drain region 14. The source region 12, the body region 13, the drift region 11 and the drain region 14 are integrated in a semiconductor body 100. The MOSFET according to FIG. 3 is implemented as a vertical MOSFET, which is a MOSFET in which the source region 12 and the drain region 14 are distant in a vertical direction of the semiconductor body 10. In this case, a current essentially flows in a vertical direction through the semiconductor body 100 when the MOSFET is in the on-state. However, implementing the MOSFET as a vertical MOSFET is only an example. The basic principle explained herein below is also applicable to lateral MOSFETs in which the source and the drain regions are distant in a lateral direction of a semiconductor body. The basic principle is also applicable to MOSFETs (not shown) in which the drain region is implemented as a buried layer that is arranged distant to the source region in a vertical direction of the semiconductor body. The buried layer can be connected to a drain terminal that is arranged on or above the same surface of the semiconductor body as the source terminal.

The source region 12 and the body region 13 are both connected to the source electrode 51 that forms the source terminal S. This is common practice in MOSFETs.

The MOSFET further includes a gate electrode 21 connected to or forming a gate terminal G. The gate electrode 21 is arranged adjacent to the body region 13, wherein a gate dielectric 22 is arranged between the gate electrode 21 and the body region 13. In a commonly known manner the gate electrode 21 serves to control a first conducting channel in the body region 13 between the source region 12 and the drift region 11. In the embodiment illustrated in FIG. 3, the gate electrode 21 is a planar electrode, i.e. the gate electrode 21 is arranged above one of the surfaces of the semiconductor body 100. However, this is only an example. The gate electrode 21 could also be implemented as a trench electrode (not shown) in a trench of the semiconductor body 100.

The MOSFET is in the on-state, when an electrical potential applied to the gate terminal G is suitable to generate a first conducting channel along the gate dielectric 22 in the body region 13, and the MOSFET is in the off-state, when there is no suitable drive potential at the gate terminal G to generate a conducting channel in the body region 13.

The MOSFET may be implemented as an enhancement MOSFET. In this case, the body region 13 is doped complementarily to the source region 12, so that the first conducting channel generated in the body region 13 and controlled by the gate electrode 21 is an inversion channel. However, the MOSFET could also be implemented as a depletion MOSFET. Further, the MOSFET may be implemented as an n-type MOSFET or as a p-type MOSFET. In an n-type MOSFET the source region 12 and the drain region 14 are n-doped, while in a p-type MOSFET the source region 12 and the drain region 14 are p-doped.

The MOSFET of FIG. 3 is implemented as a compensation or superjunction MOSFET and includes a compensation region 31 in the drift region 11. The compensation region 31 has a doping type that is complementary to the doping type of the drift region, so that a pn-junction is formed between the compensation region 31 and the drift region 11.

The MOSFET further includes a coupling arrangement 40 that is configured to electrically couple the compensation region 31 to at least one of the body region 13, the source region 12, and the source electrode 51 dependent on a control signal received at a control terminal G2. The coupling arrangement 40 is only schematically illustrated as a switch. This switch may be implemented as an electronic switch, such as a transistor, connected between the compensation region 31 and the source electrode 51. The compensation region 31 may include a contact electrode (not shown) at which the switch is connected to the compensation region 31. In the embodiment illustrated in FIG. 3, the compensation region 31 is implemented as a buried region that is below the body region 13 and distant to a surface of the semiconductor body 100 in a vertical direction. However, the compensation region 31 may include a section that extends to the surface (in a vertical plane other than the one illustrated in FIG. 3) where the compensation region 31 can be contacted. Other embodiments for implementing the coupling arrangement are explained below.

According to a further embodiment (not shown), the coupling arrangement 40 may be connected between the compensation region 31 and the gate electrode 21 instead of the body region 13, the source region 12, or the source electrode 51.

In the embodiment illustrated in FIG. 3, the compensation region 31, that has the same doping type as the body region 13, is separated from the body region 12. Specifically, the compensation region is arranged below the body region 13 and is distant to the body region 13 in the vertical direction of the semiconductor body 100, so that a section 11' of the drift region 11 is arranged between the body region 13 and the compensation region 31. This allows the compensation region 31 to assume an electrical potential that is different from the electrical potential of the body region 13. The coupling arrangement 40 is configured to electrically couple the compensation region 31 to the body region 13, or to electrically isolate the compensation region 31 from the body region 13.

The coupling arrangement 40 may assume two different operating states. In a first operating state in which the coupling arrangement 40 couples the compensation zone 31 to at least one of the body region 13, the source region 12, and the source electrode 51. In a second operating state in which the coupling arrangement 40 decouples (separates) the compensation zone 31 and the body region 13/source electrode 51, so that the compensation region 31 is floating. The coupling arrangement 40 includes a control terminal G2 through which the operating state of the coupling arrangement 40 can be controlled. The operating state of the coupling arrangement 40 is independent on whether the MOSFET is in its on-state or off-state. Thus, the MOSFET may include two different switching states, namely an on-state and an off-state, and two different operating states, namely a first operating state when the coupling arrangement 40 is in the first operating state, and a second operating state when the coupling arrangement 40 is in the second operating state.

The operating principle of the MOSFET according to FIG. 3 is now explained. For explanation purposes it is assumed that the MOSFET is an n-type enhancement MOSFET. However, the explanation provided herein below also applies to a p-type MOSFET and to a depletion MOSFET.

Like a conventional MOSFET, the MOSFET can be switched on and off by applying a suitable drive potential at the gate terminal G. When the MOSFET is switched on (is in the on-state) there is a conducting channel in the body region 13 between the source region 12 and the drift region 11 along the gate dielectric 22. When the MOSFET is switched off, the conducting channel along the gate dielectric 22 is interrupted. When the MOSFET is in the off-state and when a voltage is applied between the drain and source terminals D, S (a positive voltage in an n-type MOSFET and a negative voltage in a p-type MOSFET) a depletion zone expands in the drift region 11. This depletion zone, or the electric field associated with the depletion zone, also causes the compensation region 31 to be depleted of charge carriers. Thus, dopants (the doping charge) in the drift region 11 are "compensated" by complementary dopants in the compensation region 31. This mechanism occurs independent of whether the coupling arrangement 40 is in the first or second operation mode, i.e. independent of whether or not the compensation region 31 is coupled to the body region 13 or the source electrode 51, respectively.

The compensation effect explained above allows to provide a higher doping concentration in the drift region 11, resulting in a lower on-resistance, as compared with conventional (non-superjunction) components, without decreasing the voltage blocking capability. This basic operating principle of a superjunction device is commonly known so that no further explanation is required in this regard.

When the MOSFET is in the off-state, the compensation region 31 and the drift region 11 include electrical charges. These charges are positive charges (in the form of positively charged donor centers) in a n-doped drift region and negative charges (in the form of negatively charged acceptor centers) in a p-doped compensation region and cause a depletion region to extend in the drift region 11 and the compensation region 31. When the MOSFET is driven to switch from the off-state to the on-state, two different scenarios may occur dependent on whether the coupling arrangement 40 is in the first operation mode or in the second operation mode.

(a) When the coupling arrangement 40 is in the first operation mode, so that the compensation region 31 is electrically coupled to the source electrode 51, the drift region 11 and the compensation region 31 are "discharged" so that the depletion region between the compensation region 31 and the drift region 11 is removed. This corresponds to the operation of a conventional superjunction device.

(b) When the coupling arrangement 40 is in the second operation mode, so that the compensation region 31 is not electrically coupled to the source electrode 51 (is floating), the compensation region 31 cannot be discharged completely so that the depletion region between the compensation region 31 and the drift region 11 cannot totally be removed. This may cause a conducting channel in the drift region 11 between the drain region 14 and the "channel region" to be partially or completely be pinched off, even when the MOSFET is in the on-state. The channel region is that region of the body region 13 in which a conducting channel along the gate dielectric 22 can be controlled.

The MOSFET according to FIG. 3 has an output capacitance with an output capacitance value $C_{OSS}$ that has a characteristic according to FIG. 2 and which significantly decreases when the voltage reaches a threshold value $V_{DS0}$. The characteristic illustrated in FIG. 2 in which the output capacitance value $C_{OSS}$ has a high value for voltages below the threshold value $V_{DS0}$, and has a lower value for voltages above the threshold value $V_{DS0}$ is equivalent to the fact that at voltages lower than the threshold value $V_{DS0}$ a higher charge has to be provided to the load path of the transistor 10 in order to increase the voltage across the load path for a given voltage value $\Delta V_{DS}$ than at higher voltages, i.e. voltages higher than the threshold voltage $V_{DS0}$. The capacitance value at lower voltages can be up to 10 times to 100 times higher than the capacitance value at higher voltages. Thus, at lower voltages a charge for increasing the voltage for $\Delta V_{DS}$ is 10 times to 100 times higher than the charge required at higher voltages. MOSFETs of the type illustrated in FIG. 3 can be designed to have a breakdown voltage of between 50V and 2000V (2 kV). The voltage $V_{DS0}$ at which the output capacitance decreases is, for example, between 5V and 80 V, in particular between 10V and 80V, for such MOSFETs.

The mechanism that causes the explained voltage-dependency of the output capacitance value in the MOSFET according to FIG. 3 will now be explained for scenario (a), when the coupling arrangement 40 is in the first operation state. When the MOSFET is in the off-state charge carriers are accumulated in the drift region 11 and the compensation region 31. In the on-state there is a junction capacitor with a huge capacitance between the compensation region 31 and the drift region 11. This capacitor significantly contributes to the drain-source capacitance $C_{DS}$ and, thus, significantly contributes to the output capacitance $C_{OSS}$ of the MOSFET. When the MOSFET is switched off, i.e. when the channel along the gate dielectric 22 is interrupted, this junction capacitance has to be charged (which is equivalent to removing dopant charges from the compensation region 31 and the drift region 11) before the voltage across the drift region 11 and, thus, the voltage between the drain and source terminals D, S, can significantly increase. When the compensation region 31 and the drift region 11 have been charged, a depletion region expands in the drift region 11 and the compensation region 31. At the time when the compensation region 31 has been completely charged, the junction capacitor "disappears" causing a rapid decrease of the output capacitance $C_{OSS}$. The slope of the decrease of the output capacitance $C_{OSS}$ is steep and occurs at the voltage $V_{DS0}$ shown in FIG. 2. $V_{DS0}$, which is, e.g., between 5V and 80V, is dependent on the geometry of the compensation region 31 and its doping concentration. $V_{DS0}$ represents a specific value of the drain-source voltage $V_{DS}$ at which the drift region 11 is completely depleted by a space charge region that expands in a direction perpendicular to a current flow direction of the MOSFET.

The doping concentration of the drift region 11 is, for example, in the range of between $10^{14}$ (1E14) $cm^{-3}$ and $10^{16}$ (1E16) $cm^{-3}$. The doping concentration of the compensation region 31 may be in the same range.

A superjunction device with compensation region 31 that, as in scenario (a), is charged when the MOSFET is switched off and is discharged when the MOSFET is switched on has a higher output capacitance $C_{OSS}$, but a lower on-resistance, than a conventional MOSFET. The output capacitance $C_{OSS}$ is reduced when the compensation region 31, as in scenario (b), is not electrically coupled to the source electrode 51, i.e. when the compensation region 31 is floating. However, there is an increased on-resistance in this case. Thus, through the controllable coupling arrangement 40 the output capacitance and the on-resistance of the MOSFET can be varied. There is a tradeoff in that a decrease of the output capacitance, resulting in decreased of capacitive losses, is associated with an increase of the on-resistance, resulting in higher ohmic losses. A decrease of the on-resistance, resulting in decreased ohmic losses, is associated with an increase of the output capacitance, resulting in higher capacitive losses.

The operating principle which has been explained for an n-type MOSFET hereinbefore also applies to a p-type MOSFET, wherein in a p-type MOSFET the individual semiconductor regions have a complementary doping type, and the voltages have a reversed polarity.

The compensation region 31 and the drift region 11 form a JFET (junction FET) between the body region 13 and the drain region 14. A circuit symbol of this JFET is illustrated in FIG. 3. When the MOSFET is in the off-state there are two depletion regions that expand in the drift region 11, a first depletion region expanding from the pn junction between the body region 13 and the drift region 11, and a second depletion region expanding from the pn junction between the compensation region 31 and the drift region 11.

Figure 4:
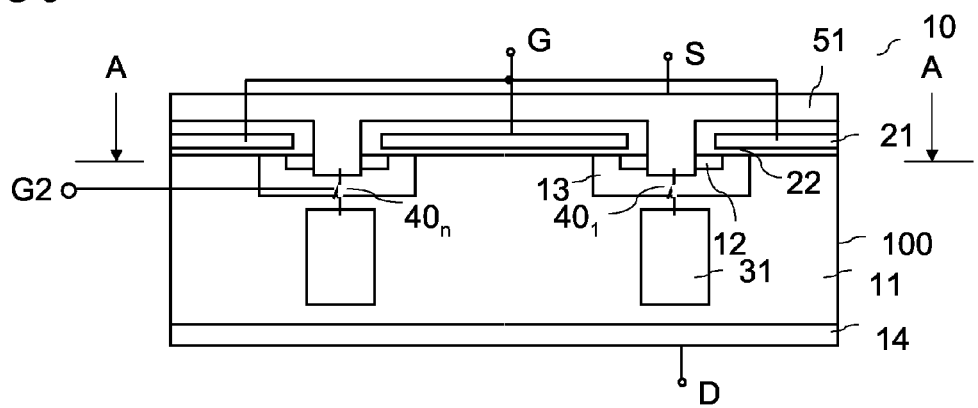
FIG. 4 schematically illustrates a vertical cross sectional view of a MOSFET including a plurality of transistor cells.

The MOSFET according to FIG. 3 can be implemented with a plurality of identical structures, which are commonly known as transistors cells. In FIG. 3 only one transistor cell is illustrated. FIG. 4 illustrates a schematic cross sectional view of a MOSFET with a plurality of transistor cells. These transistor cells are connected in parallel by having the source regions 12 of the individual cells connected to a common source electrode 51, by having the gate electrodes 21 of the individual cells connected to a common gate terminal G, and by having the drain and drift regions 14, 11 of the individual cells connected to a common drain terminal D. The drift region 11 and the drain region 14 are common to the individual transistor cells.

The coupling arrangement 40 is configured to couple the compensation regions 31 of the individual cells to at least one of the body region 13, the source region 12 and the source electrode 51 dependent on a control signal received at the control terminal. For this, the coupling arrangement 40 includes a plurality of coupling cells, wherein each coupling cell serves to couple the compensation region 31 of at least one transistor cell to at least one of the body region 13, the source region 12 and the source electrode 51 of the transistor cell. In FIG. 4, two coupling cells $40_1$, $40_n$ are shown where each coupling cell serves to connect one compensation region 31 to one body region 13, source region 12 or source electrode 51. In the embodiment illustrated in FIG. 4, one compensation region 31 and one body region 13 is common to two transistor cells. However, this is only an example. It is also possible to implement the transistor cells such that only one compensation region 31, only one body region 13 and only one coupling cell is assigned to one transistor cell.

The coupling arrangement 40 can be implemented such that all the coupling cells are operated in the same operating state, which is the first operating state or the second operating state. However, it is also possible to implement the coupling arrangement 40 such that the individual coupling cells can be operated in the first or second operating state independently, so that some transistor cells can be operated with floating compensation regions 31, while others can be operated with their compensation regions 31 connected to the source electrode 51.

Figure 5:
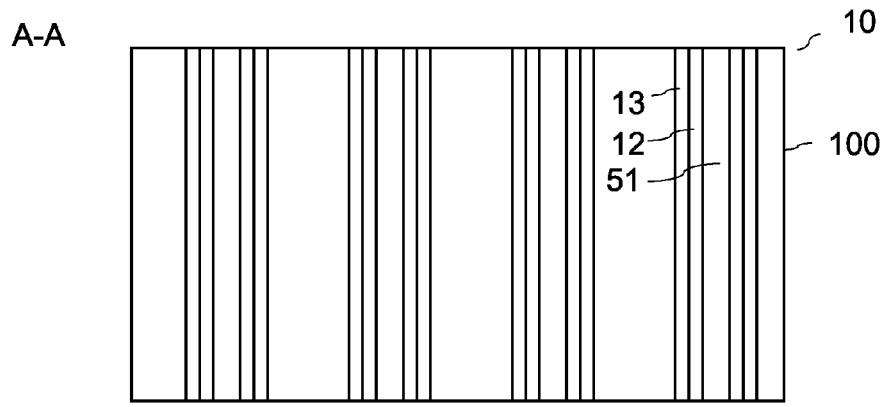
FIG. 5 schematically illustrates a horizontal cross sectional view of a MOSFET implemented with elongated transistor cells.

The individual transistor cells can be implemented with a conventional transistor cell geometry. FIG. 5 illustrates a schematic horizontal cross sectional view of a MOSFET with elongated or stripe cells. In this case, the source and body regions 12, 13 of the individual cells have a stripe geometry.

Figure 6:
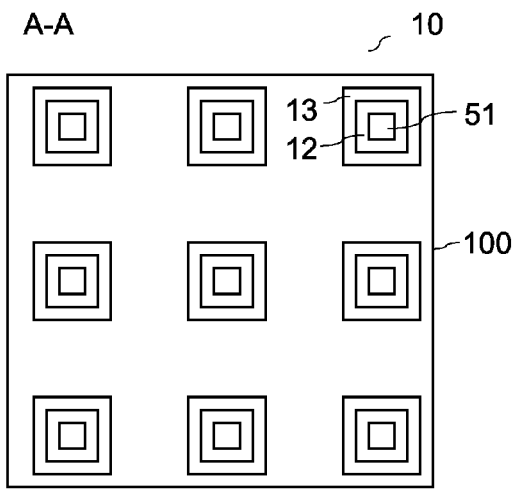
FIG. 6 schematically illustrates a horizontal cross sectional view of a MOSFET implemented with rectangular transistor cells.
Figure 7:
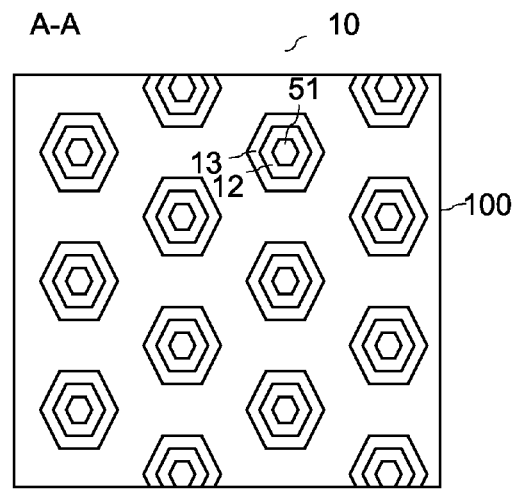
FIG. 7 schematically illustrates a horizontal cross sectional view of a MOSFET implemented with hexagonal or polygonal transistor cells.

Referring to FIGS. 6 and 7 it is also possible to implement the transistor cells with a rectangular or square geometry (see FIG. 6) or with a hexagonal (see FIG. 7) or any other polygonal geometry. In this case, the body regions 13, have a rectangular or square, a hexagonal or polygonal geometry.

FIGS. 5 to 7 illustrate horizontal cross sectional views of the MOSFET in a section plane A-A illustrated in FIG. 4. The compensation regions 31 are not illustrated in FIGS. 5 to 7. The geometry of the compensation regions 31 in the horizontal plane may correspond to the geometry of the body region 13. Thus, in a MOSFET with stripe cells the compensation regions 31 may have a stripe geometry, in a MOSFET with a rectangular or square geometry, the compensation regions 31 may have a rectangular or square geometry, and in a MOSFET with hexagonal or polygonal cells, the compensation regions 31 may have a hexagonal or polygonal geometry. In each of these cases, the compensation regions 31 may be arranged below the body region 13 in a vertical direction of the semiconductor body 100, as illustrated in FIG. 4.

However, it is also possible to implement the compensation regions 31 with a geometry that is different from the geometry of the body region 13. For example it is possible to implement the compensation regions 31 with a stripe geometry, while the transistor cells have a rectangular, square, hexagonal or polygonal geometry. Further, it is possible to arrange the compensation regions 31 so that the compensation regions 31 are not aligned with the body regions 13, i.e. the compensation regions 31 do not necessarily have to be arranged below the body regions 13.

Figure 8:
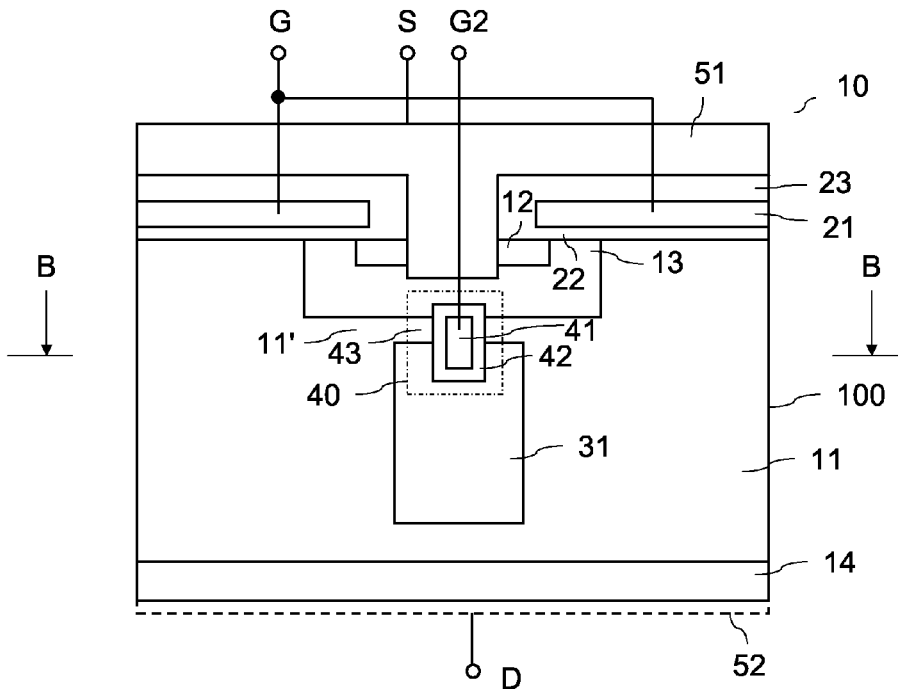
FIG. 8 schematically illustrates a vertical cross sectional view of a MOSFET including a coupling arrangement with a control electrode.

FIG. 8 illustrates a schematic vertical cross sectional view of a MOSFET illustrating one embodiment of implementing the coupling arrangement 40. In this embodiment, the compensation region 31 is arranged below the body region 13 and distant to the body region 13 in the vertical direction of the semiconductor body 100. The coupling arrangement 40, from which only one coupling cell is illustrated in FIG. 8, includes a control electrode 41 that is dielectrically insulated from the semiconductor body 100 by a control electrode dielectric 42. The control electrode 41 extends from the body region 13 to or into the compensation region 31. The control electrode 41 extends through a section 11' of the drift region 11 that separates the body region 13 from the compensation region 31. In this section 11' of the drift region 11 a channel region 43 of the coupling arrangement is formed along the control electrode dielectric 42 between the body region 13 and the compensation region 31.

The control electrode 41 is electrically connected to the control electrode G2 in a manner which is not illustrated in detail in FIG. 8. The control electrode 41 can be implemented with a conventional electrode material, such as a metal or a highly doped polycrystalline semiconductor material, such as polysilicon. The control electrode dielectric 42 can be implemented with a conventional dielectric material, such as an oxide, a nitride, or a high-k-dielectric.

The control electrode 41 serves to control an inversion channel in the channel region 43 between the compensation region 31 and the body region 13. This channel is a channel for p-type charge carriers when the compensation region 31 and the body region 13 are p-doped, and is a conducting channel for n-type charge carriers when the compensation region 31 and the body region 13 are n-doped. The coupling arrangement 40 is in the first operating state, when the control electrode 41, by applying a suitable drive potential to the control terminal G2, is driven to generate the inversion channel in the channel region 43. In an n-type MOSFET, in which the source region 12 is n-doped and the body region 13 is p-doped, an inversion channel is generated in the channel region 43 between the body region 13 and the compensation region 31 when an electrical potential is applied to the control terminal G2 that is below the source potential, which is the electrical potential of the body region 13, the source region 12 and the source electrode 51, respectively. According to one embodiment, a voltage to be applied between the control terminal G2 and the source electrode 51 or the source terminal S in order to generate a conducting channel is in the range of between −0.1 V and −15V. In a p-type MOSFET, in which the source region 12 is p-doped and the body region 13 is n-doped, the electrical potential to be applied to the control terminal G2 is a positive potential relative to the source potential in order to generate a conducting channel in a channel region 43. A voltage, to be applied between the control terminal G2 and the source terminal S is, for example, in the range of between 0.1 V and 15V.

The coupling arrangement 40 is in the second operating state when the control electrode 41 is driven such that there is no conducting channel along the control electrode dielectric 42 between the body region 13 and the compensation region 31. In this case, the compensation region 31 is floating. The coupling arrangement 40 is in the second operating state when the absolute value of a voltage applied between the control terminal G2 and the source terminal S is below a threshold value. This threshold value is, for example, between 0.5 V and 2V.

The MOSFET according to FIGS. 3 to 8 can be used like a conventional MOSFET as an electronic switch for switching an electronic load, as it has been explained with reference to FIG. 1. However, the MOSFET according to FIGS. 3 to 8, besides the gate terminal G, has at least one control terminal through which the operating state can be varied in order to adjust the output capacitance and the on-resistance, respectively. The MOSFET acts like a conventional superjunction MOSFET when the coupling arrangement 40 is in the first operating state. In this case, the compensation region 31 is electrically coupled to the body region 13 through the conducting channel in the channel region 43 along the control electrode dielectric 42. Further, the MOSFET can be operated with a reduced output capacitance, but an increased on-resistance when the coupling arrangement 40 is operated in the second operating state, so that the conducting channel between the body region 13 and the compensation region 31 is interrupted and so that the compensation region 31 is floating. In this second operating state the MOSFET still acts like a conventional superjunction device, but one with another set of electrical data, in particular with another output capacitance and another on-resistance.

The geometry of the control electrode 41 and the control electrode dielectric 42 in the horizontal plane may correspond to the transistor cell geometry. This is explained next with reference to FIGS. 9 to 11 in which schematically horizontal cross sectional views of MOSFETs with different cell geometries are illustrated in horizontal section planes that correspond to horizontal section plane B-B illustrated in FIG. 8.

Figure 9:
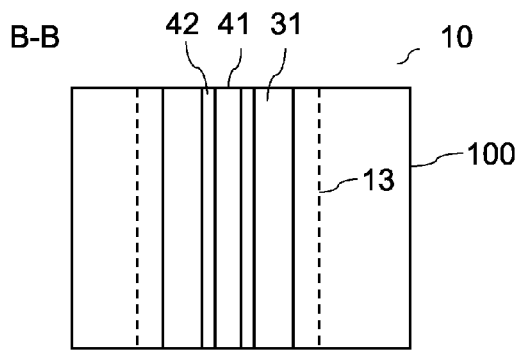
FIG. 9 illustrates a horizontal cross sectional view of the MOSFET according to FIG. 8 when implemented with elongated transistor cells.

FIG. 9 illustrates a horizontal cross sectional view of a MOSFET having a stripe cell geometry, so that the body region 13 has a stripe geometry. Section plane B-B does not cut through the body region 13. However, for a better understanding the position and the geometry of the body region 13 is also illustrated in dashed lines in FIGS. 9 to 11.

Referring to FIG. 9, the compensation region 31, the control electrode 41 and the control electrode dielectric 42 also have a stripe geometry. In the embodiment illustrated in FIG. 9 a width of the compensation region 31 is smaller than a width of the body region 13. The "width" in this connection is the dimension of the compensation region 31 and the body region 13 in a direction perpendicular to a longitudinal direction of the compensation region 31 and the body region 13. However, having a compensation region 31 with a lower width than the body region 13 is only an example. It is also possible to implement the compensation region 31 and the body region 13 with the same width, or to implement the compensation region 31 with a larger width than the body region 13. This also applies to the other embodiment explained with reference to FIGS. 10 and 11 below.

Figure 10:
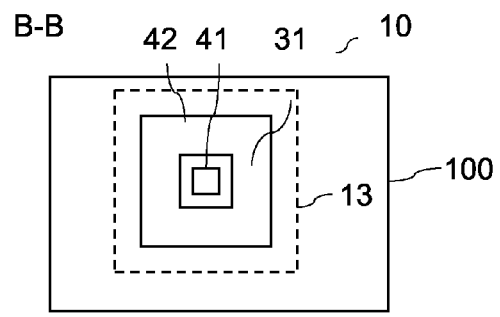
FIG. 10 illustrates a horizontal cross sectional view of the MOSFET according to FIG. 8 when implemented with rectangular transistor cells.

FIG. 10 illustrates a horizontal cross sectional view of a MOSFET with a rectangular, specifically with a square cell geometry. In this example, the body region 13 has a rectangular, specifically a square geometry. The compensation region 31 also has a rectangular, specifically a square geometry. The control electrode 41 also has a rectangular, specifically a square geometry.

Figure 11:
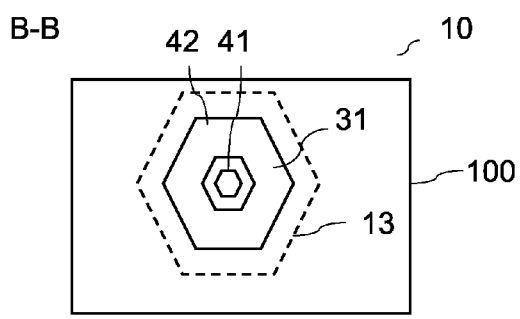
FIG. 11 illustrates a horizontal cross sectional view of the MOSFET according to FIG. 8 when implemented with hexagonal transistor cells.

FIG. 11 illustrates an embodiment, in which a transistor cell has a hexagonal geometry, the compensation region 31 has a hexagonal geometry, and the control electrode 41 has a hexagonal geometry. In this connection it should be noted that besides a hexagonal geometry any other polygonal geometry may be used as well.

Implementing the body region 13, the compensation region 31 and the control electrode 41 with same geometries is not mandatory. The geometry of the compensation region 31 could also be different from the geometry of the body region 13, and the geometry of the control electrode 41 could also be different from the geometry of the compensation region 31. For example, each of the following geometries can be used independently for each of the body region 13, the compensation region 31 and the control electrode 41: rectangular, square, hexagonal, polygonal, circular.

Figure 12:
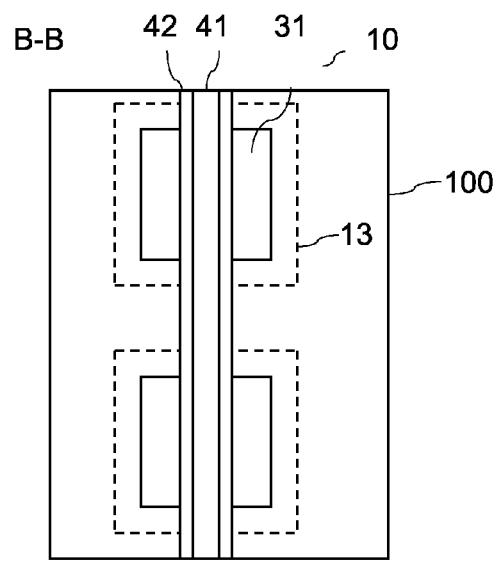
FIG. 12 illustrates a horizontal cross sectional view of the MOSFET according to FIG. 8 when implemented with rectangular transistor cells and a stripe-shaped control electrode.

FIG. 12 illustrates a horizontal cross sectional view of a MOSFET in which the individual transistor cells have a rectangular geometry, i.e. the body regions 13 have a rectangular geometry, in which the compensation regions 31 also have a rectangular geometry. The control electrode 41 has a stripe geometry, so that one control electrode 41 is common to several transistor cells. Implementing the compensation region 31 with the same geometry as the body region 13 is only an example. It is also possible to implement the body region 13 and the compensation region 31 with different geometries.

Figure 13:
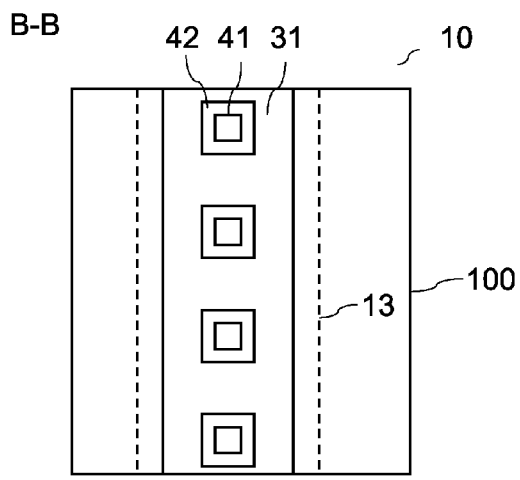
FIG. 13 illustrates a horizontal cross sectional view of the MOSFET according to FIG. 8 when implemented with elongated transistor cells and rectangular control electrodes.

FIG. 13 illustrates an embodiment in which the compensation region 31 has a stripe geometry and in which several control electrodes 41 each having a rectangular geometry are coupled to one compensation region 31. Instead of a rectangular geometry a circular, hexagonal or any other polygonal geometry may be used for the control electrode 41 as well.

The connection of the control electrode 41 to the control terminal G2 is only schematically illustrated in FIG. 8. The control terminal G2 may be implemented as an electrode that is arranged above the semiconductor body 100 and to which the control electrode 41 is connected to at a position which is not illustrated in the vertical cross sectional view illustrated in FIG. 8.

Figure 14:
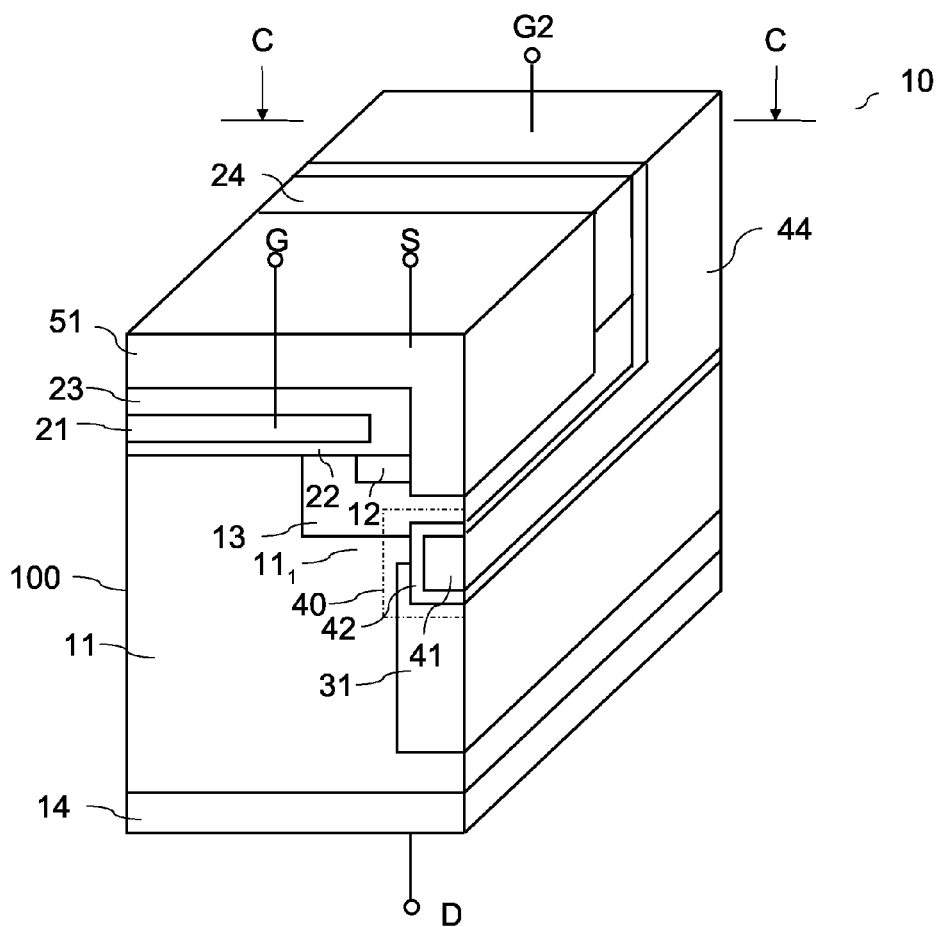
FIG. 14 schematically illustrates a perspective sectional view of a transistor cell of a MOSFET including a coupling arrangement with a control electrode, a connection electrode and a contact electrode.

FIG. 14 schematically illustrates a perspective sectional view of a MOSFET with stripe transistor cells in order to illustrate one possible way of contacting the (buried) control electrode 41. In FIG. 14, only one transistor cell of the MOSFET is illustrated. This transistor cell has a stripe geometry, and the compensation region 31 and the control electrode 41 also have a stripe geometry. The control electrode 41 essentially extends parallel to the compensation region 31 and the body region 13 between the body region 13 and the compensation region 31. The control electrode 41, in this example, includes a connection electrode 44 which in the vertical direction of the semiconductor body extends through the body region 13, and the source region 12 to a contact electrode 45 (shown in FIG. 15) that is connected to the control terminal G2 or that forms the control terminal G2.

Figure 15:
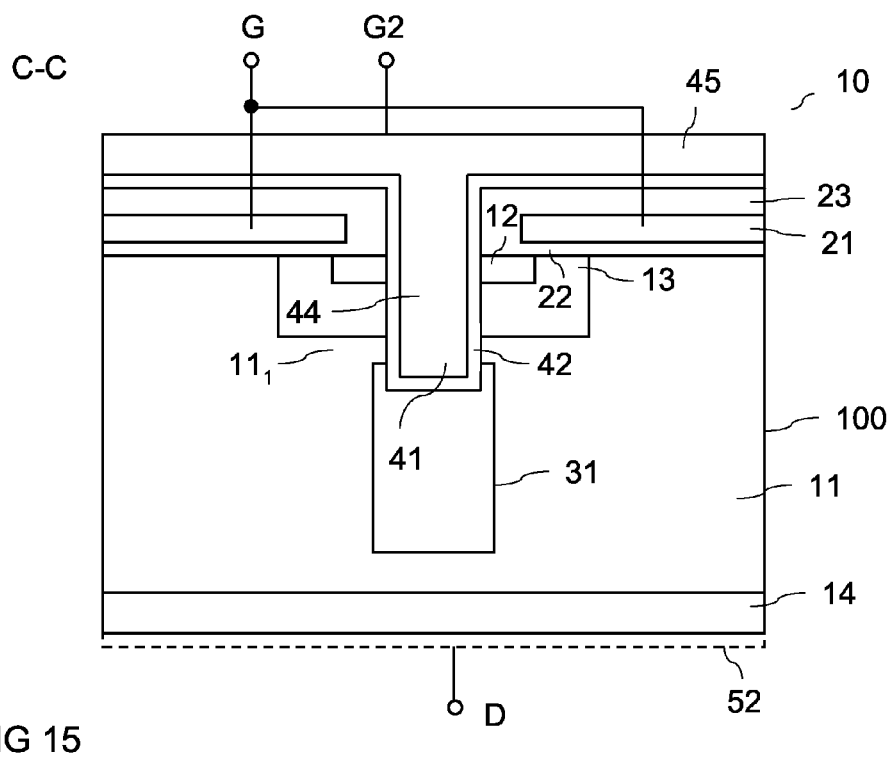
FIG. 15 schematically illustrates a vertical cross sectional view of the transistor cell of FIG. 14 in a section plane C-C.

FIG. 15 illustrates a schematic vertical cross sectional view of the MOSFET of FIG. 14 in a section plane C-C that cuts through the region of the MOSFET in which the connection electrode 44 and the contact electrode 45 are arranged. As can be seen from FIG. 14, the control electrode 41 and the connection electrode 44 are dielectrically insulated from the body and source regions 13, 12 by the control electrode dielectric 42. The contact electrode 45 is arranged above the semiconductor body 100 and is electrically insulated from the gate electrode 21. An electrical insulation between the contact electrode 45 and the gate electrode 21 can be provided by the same insulation layer and/or dielectric layer 23 that is arranged between the gate electrode 21 and the source electrode 51. Optionally, the control electrode dielectric 42 is also arranged between the contact electrode 45 and the gate electrode 21.

The source electrode 51 is arranged distant to the contact electrode 45 in a lateral direction and is electrically insulated from the source electrode 51 by an insulation layer. Referring to FIG. 15, the source region 12 and the gate electrode 21 may also be arranged below the contact electrode 45. However, providing the source region 12 and the gate electrode 21 below the contact electrode 45 is optional. According to a further embodiment, the source region 12 and the gate electrode 21 do not extend to below the contact electrode 45. The control electrode 41, the connection electrode 44 and the contact electrode 45 can be formed from the same conducting material such as, e.g., a metal or a highly doped polycrystalline semiconductor material. However, it is also possible to implement these electrodes 41, 44, 45 with different electrode materials. In a manner not illustrated in detail, the contact electrode 45 may be connected to control electrodes 41 of a plurality of transistor cells each through a connection electrode 44.

Figure 16:
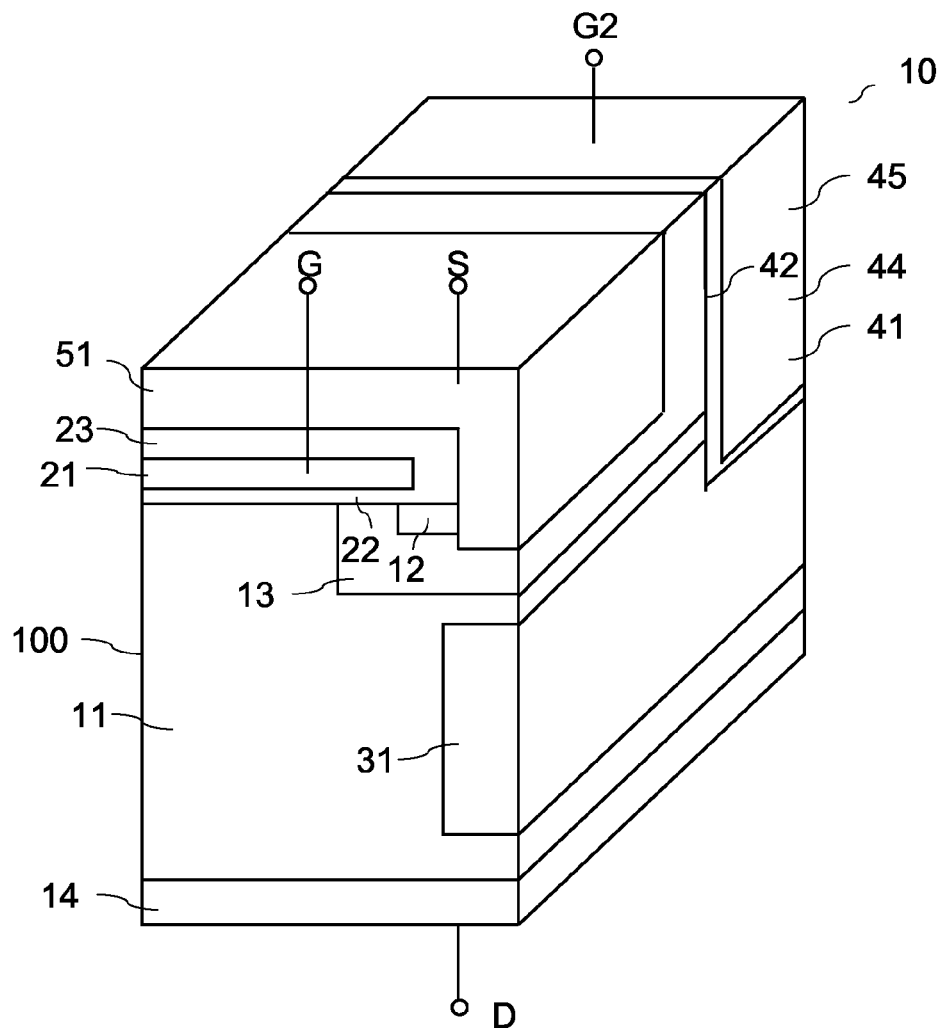
FIG. 16 schematically illustrates a perspective sectional view of a transistor cell of a MOSFET according to a further embodiment.

In the embodiment illustrated in FIG. 14, the control electrode 41 has an elongated (stripe) geometry and extends along the compensation region 31 and the body region, so that the compensation region 31 can be electrically connected to the body region 13 along its complete longitudinal length. However, this is only one possible example. Referring to FIG. 16 it is also possible to provide the control electrode 41 only at one position or to provide several control electrodes 41 at different positions along the compensation region 31. FIG. 16 illustrates a schematic perspective sectional view of a MOSFET in which the control electrode 41 does not completely extend along the compensation region 31, but is only arranged below the connection electrode 44.

Figure 17:
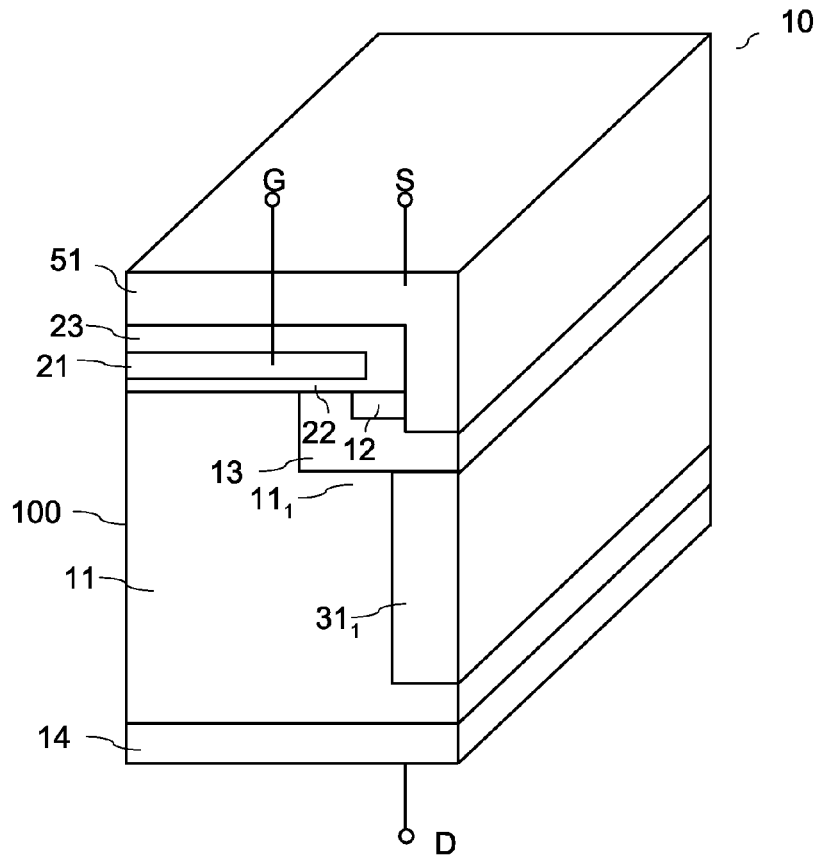
FIG. 17 schematically illustrates a perspective sectional view of a conventional transistor cell.

According to one embodiment, the MOSFET includes both, transistor cells that are coupled to the body region 13 and the source electrode 51, respectively, via a coupling arrangement 40, and conventional transistor cells. A "conventional transistor cell" is a transistor cell that has its compensation region permanently connected to the body region 13. For illustration purposes only, a schematic perspective sectional view of a conventional transistor cell with a stripe geometry is illustrated in FIG. 17. Of course, any other cell geometry may be implemented as well. In the transistor cell of FIG. 18, a compensation region 31' adjoins the body region 13 and is, therefore, electrically connected to the source electrode 51. In the conventional cell of FIG. 17, like reference characters denote like regions as in the transistor cells explained with reference to FIGS. 3 to 16.

In the following, conventional transistor cells are referred to as transistor cells of a first type, while transistor cells with a coupling arrangement 40 are referred to as transistor cells of a second type. The individual transistor cells may be implemented such that they include one common drift region and one common drain region.

Figure 18:
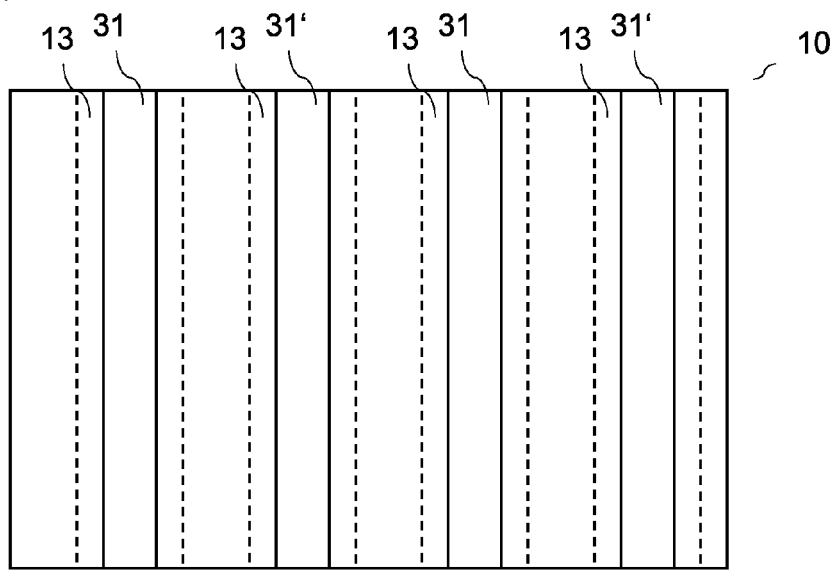
FIG. 18 schematically illustrates a first embodiment of arranging transistor cells with a coupling arrangement and conventional transistor cells in a semiconductor body.
Figure 19:
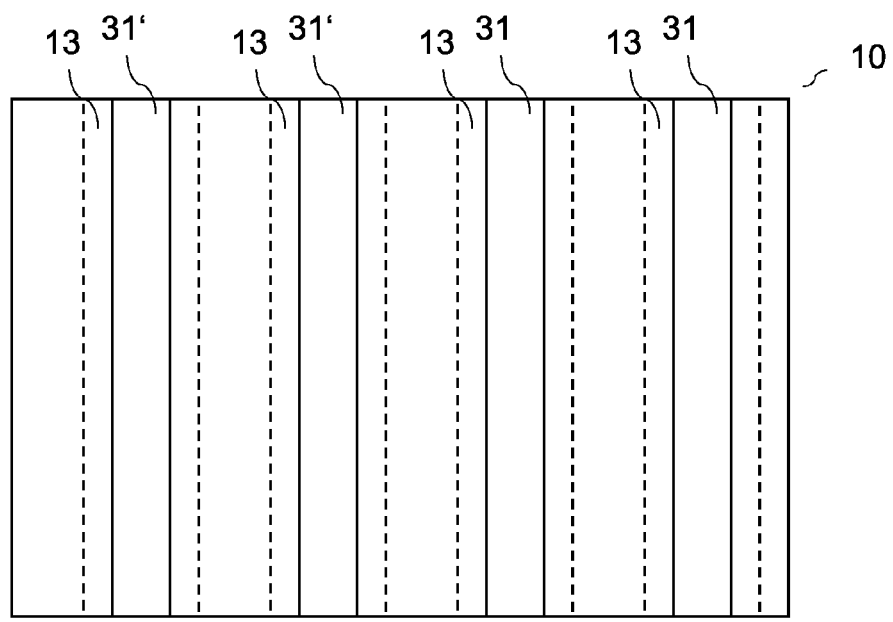
FIG. 19 schematically illustrates a second embodiment of arranging transistor cells with a coupling arrangement and conventional transistor cells in a semiconductor body.

Transistor cells of the first and second type can be arranged in the semiconductor body 100 in many different ways. According to a first embodiment that is illustrated in FIG. 19, the transistor cells of the first and second type are arranged alternately. FIG. 18 illustrates a horizontal cross sectional view in a section plane that corresponds to section plane B-B in FIG. 8 and that cuts through the compensation regions 31, 31'. In the embodiment of FIG. 19, the transistor cells and the compensation regions 31, 31' have a stripe geometry. However, any other cell geometry and compensation region geometry may be used as well.

According to a further embodiment illustrated in FIG. 19, which also shows a horizontal cross sectional view of the semiconductor body, a group of several cells of the second type (having a compensation region 31) is arranged next to a group of several cells of the first type (having a compensation region 31').

Figure 20:
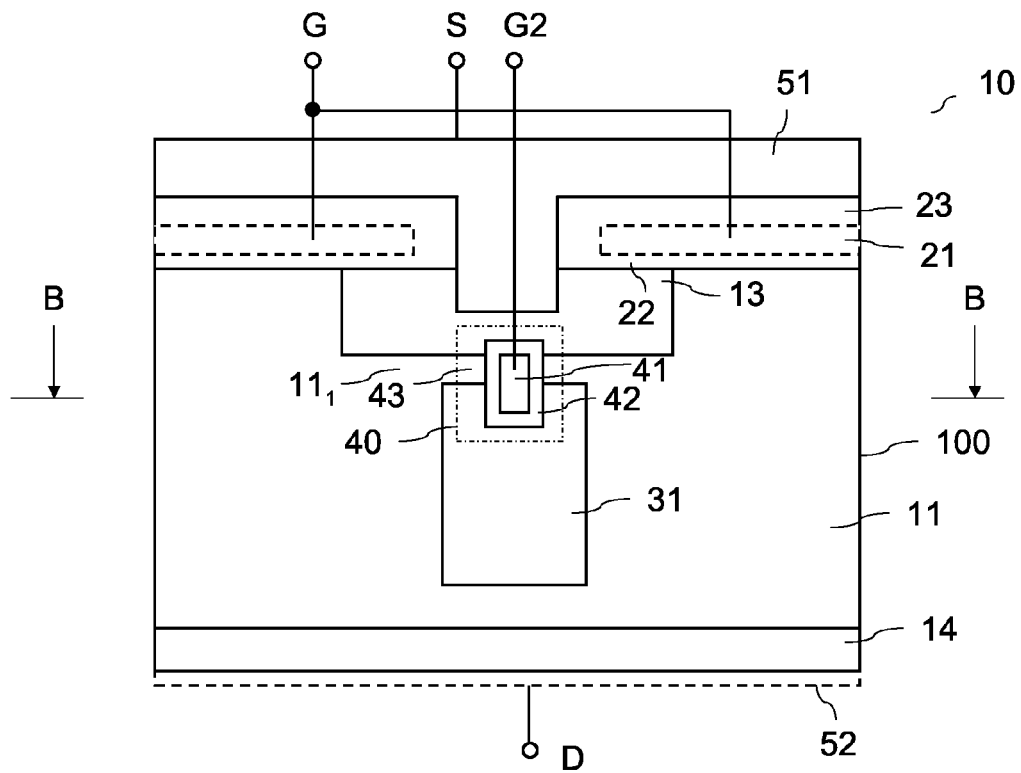
FIG. 20 schematically illustrates a vertical cross sectional view of transistor cells that include a compensation region and a coupling arrangement and that do not include a channel region.

According to one embodiment, in a MOSFET that includes transistor cells of the first and second type, the transistor cells of the second type are implemented without a channel region, which means without a source region 12 and/or without a gate electrode 21. A vertical cross sectional view of a transistor cell of the second type which does not include a source region is illustrated in FIG. 20. The gate electrode 21 (illustrated in dashed lines) is optional in this case. In a MOSFET with transistor cells of the first and second type, the transistor cells of the second type, which are those cells that have their compensation regions coupled to the source or body region through a coupling arrangement, only serve to adjust the output capacitance and the on-resistance when they are implemented without channel region. The current flowing through the drift region 11 when the MOSFET is in its on-state is only provided through the channel regions of the transistor cells of the first type. The "channel regions" of the conventional cells are the regions in the body region 12 from the source along the gate dielectric 22 of the conventional cells to the drift region 11 (see FIG. 17).

Figure 21:
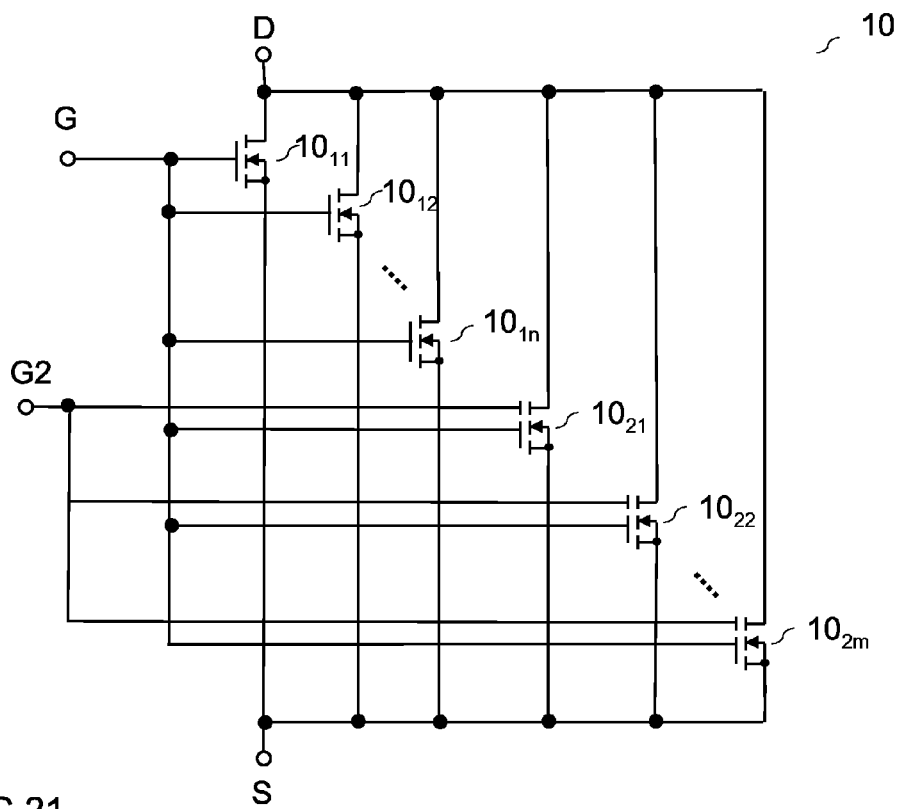
FIG. 21 shows the circuit diagram of a MOSFET including transistor cells with a coupling arrangement and conventional transistor cells according to a first embodiment.
Figure 22:
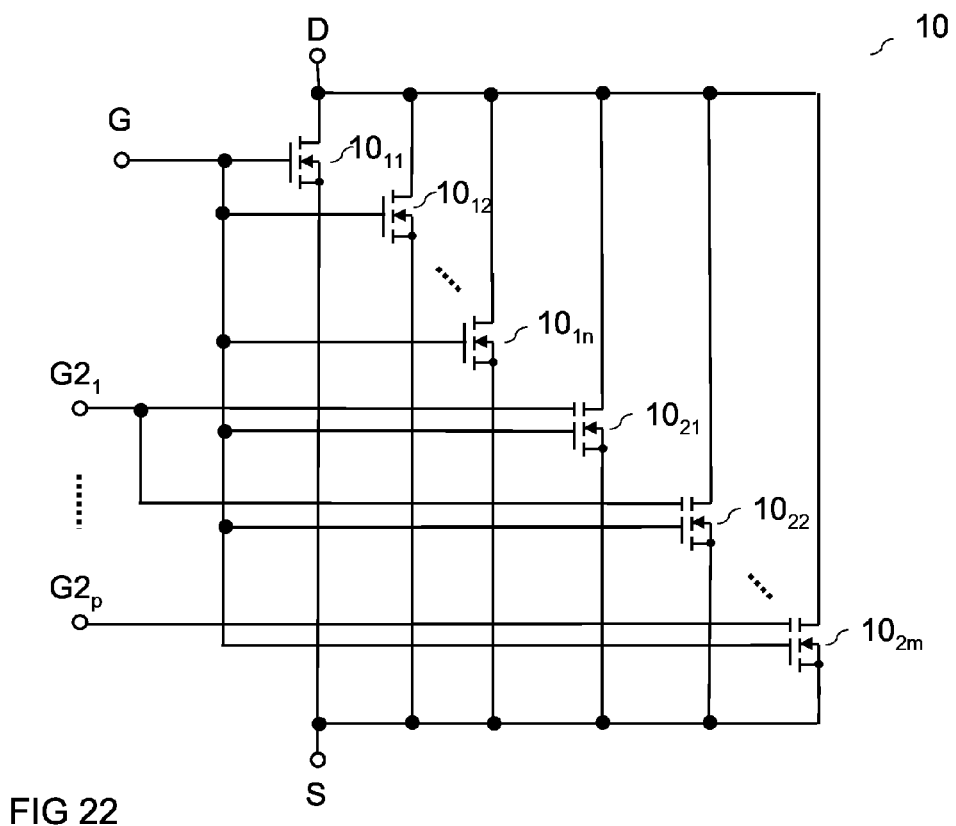
FIG. 22 shows the circuit diagram of a MOSFET including transistor cells with a coupling arrangement and conventional transistor cells according to a second embodiment.

The operating principle of a MOSFET with transistor cells of the first and second type will now be explained with reference to FIG. 21. FIG. 22 illustrates a circuit diagram representing the MOSFET 10. The circuit diagram includes a plurality of n first transistors $1_{11}, \ldots, 1_{1n}$, each representing transistor cell of the first type or a group of transistor cells of the first type, and m second transistors $1_{21}, \ldots, 1_{2m}$, each representing a transistor cell of the second type or a group of transistor cells of the second type. The individual cells can be implemented in one of the ways explained before.

The individual transistor cells are connected in parallel. This is represented in FIG. 22 in that the drain source paths of the transistors $10_{1_1}, \ldots, 10_{1_n}, 10_{2_1}, \ldots, 10_{2_m}$ are connected in parallel and that the transistors have their gate terminals coupled together to form the gate terminal G. The transistors that represent the transistor cells of the second type have a control terminal besides the gate terminal for adjusting the output capacitance and the on-resistance. In the embodiment illustrated in FIG. 22, the cells of the second type have their control terminals coupled together to form the control terminal G2 of the MOSFET.

The MOSFET can be operated with a first on-resistance and a first output capacitance, when the cells of the second type are operated such that the coupling arrangement is in the first operating state, so that the compensation regions of the cells of the second type are electrically connected to one the body region, the source region, and the source electrode. The MOSFET can also be operated with a second on-resistance that is higher than the first on-resistance and with a second output capacitance that is lower than the first output capacitance, when the cells of the second type are operated such that the coupling arrangement is in the second operating state, so that the compensation regions of the cells of the second type are floating. A ratio between the first and the second on-resistance and between the first and the second output capacitance is dependent on a ratio between the overall size of the active areas of the transistor cells of the first type and the overall size of the active areas of the transistor cells of the second type. Assume, for example, that the individual cells have identical sizes. In this case, the overall size of the active areas of the cells of the first type and of the cells of the second type is proportional to the number of cells of the first and second type, respectively. According to one embodiment, the size ratio $A_{CON}/A_{CA}$ between the overall size of the active areas of the cells of the first type and the overall size of the active areas of the cells of the second type is between 10:1 and 1:10, in particular between 2:1 and 1:2, or even 1.5:1 and 1:1.5.

Figure 23:
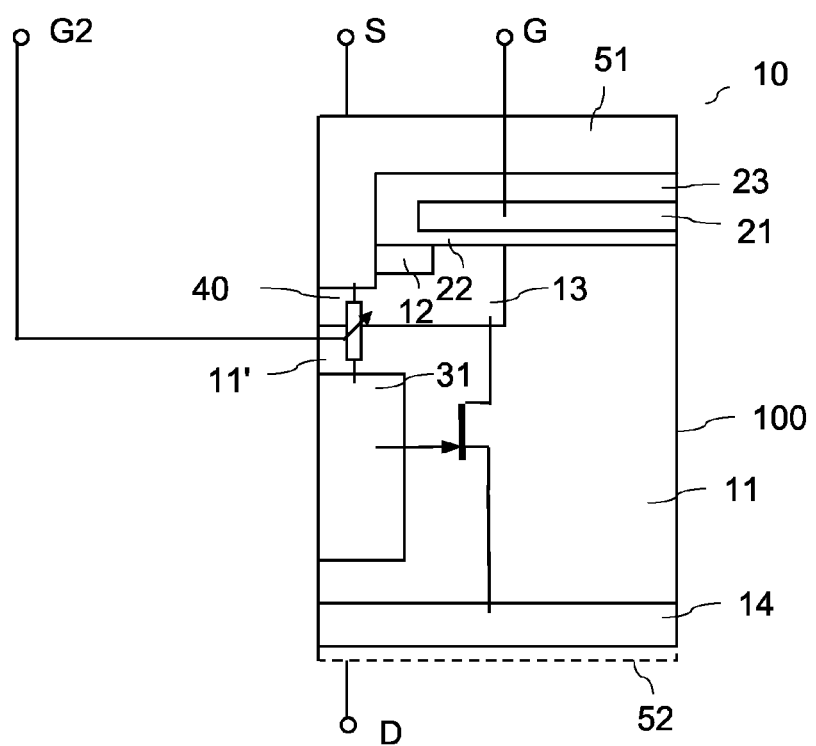
FIG. 23 schematically illustrates a vertical cross sectional view of a MOSFET including a coupling arrangement according to a further embodiment connected between a compensation region and a source electrode.

Referring to a further embodiment, illustrated in FIG. 22, the MOSFT includes a plurality of p, with p≥2 of control terminals $G2_1$, $G2_p$. Each of these control terminals $G2_1$, $G2_p$ serves to control the operating state of a coupling arrangement 40 of a group of cells of the second type, where each of these groups includes at least one cell of the second type. In the MOSFT of FIG. 23, the on-resistance and the output capacitance may each be adjusted to p+1 different values by varying the number of the groups of cells of the second type that are operated in the first or second operating state.

In the embodiments explained before, the coupling arrangement 40 acts like a switch that, dependent on a drive signal applied to the control terminal, electrically connects the compensation region 31 to one of the body region 13, source 12, and source electrode 51 or leaves the compensation region 31 floating.

According to a further embodiment illustrated in FIG. 23, the coupling arrangement also controls a current that may flow between the compensation region 31 and one of the body region 13, source 12, and source electrode 51. For this, the coupling arrangement 40 may be implemented like a variable resistor having a resistance controlled by a drive signal applied to the control terminal G2. When the resistance of this variable resistor is controlled to be very high, the compensation region 31 is not discharged or is only very slowly discharged when the MOSFET switches on, while the compensation region 31 is rapidly discharged when the resistance is low. The variable resistor may be implemented with a control electrode 41 and dielectric 42 as shown in FIG. 8, wherein the resistance between the compensation region 31 and the body region 13 or source electrode can be adjusted by suitable selecting the drive potential applied to the control electrode 41.

The output capacitance $C_{OSS}$ of the MOSFET not only influence switching losses of the MOSFET, but also influences the dynamic behavior of the MOSFET, such as the slope of rising and falling edges of load current through the MOSFET and of the drain-source voltage, when the MOSFET is switched on and off, where a low output capacitance $C_{OSS}$ may result in steep slopes. Adjusting the maximum discharging current that may flow from the compensation region 31 to a low value may result in a low output capacitance at the time of switching and may, therefore, result in steep switching slopes. The compensation region 31 is nevertheless discharged after a while, resulting in a low on-resistance after a delay time after the time of switching.

The coupling arrangement 40 could also be implemented with circuit elements that are capable of controlling or limiting the current between the compensation region 31 and one of the source electrode 51, the body region 13, the source region 12, and the gate electrode 21 dependent on a drive signal applied to the control terminal G2. In particular, the coupling arrangement 40 can be configured to limit the current to or from the compensation region 31 to a maximum value that is dependent on the control signal at the control terminal. Conventional controllable current limiters may be used in this connection.

Referring to what has been explained before, there is a tradeoff between ohmic losses and capacitive losses, wherein this tradeoff is dependent on the load condition of the transistor. The load condition is, for example, defined by the load current flowing through the transistor in its on-state and/or by a switching frequency at which the transistor is operated. When, for example, the load current is high, it is desirable to reduce the on-resistance in order to decrease the ohmic losses, even if this results in a small increase of the total switching losses. Although the capacitive losses are independent of the current the switching losses in transition phases during turn-on and/or during turn-off increase at high load currents. The ohmic losses mainly govern the overall losses at high load currents because they increase with the square of the load current. According to one embodiment the MOSFET is, therefore operated such that with increasing load current the on resistance is reduced, while with increasing switching frequency the output capacitance is reduced.

The on-resistance can be reduced by driving the transistor cells of the second type such that the number of cells that are operated in the first operating state is increased. The output capacitance can be reduced by driving the transistor cells of the second type such that the number of cells that are operated in the second operating state is increased.

Figure 24:
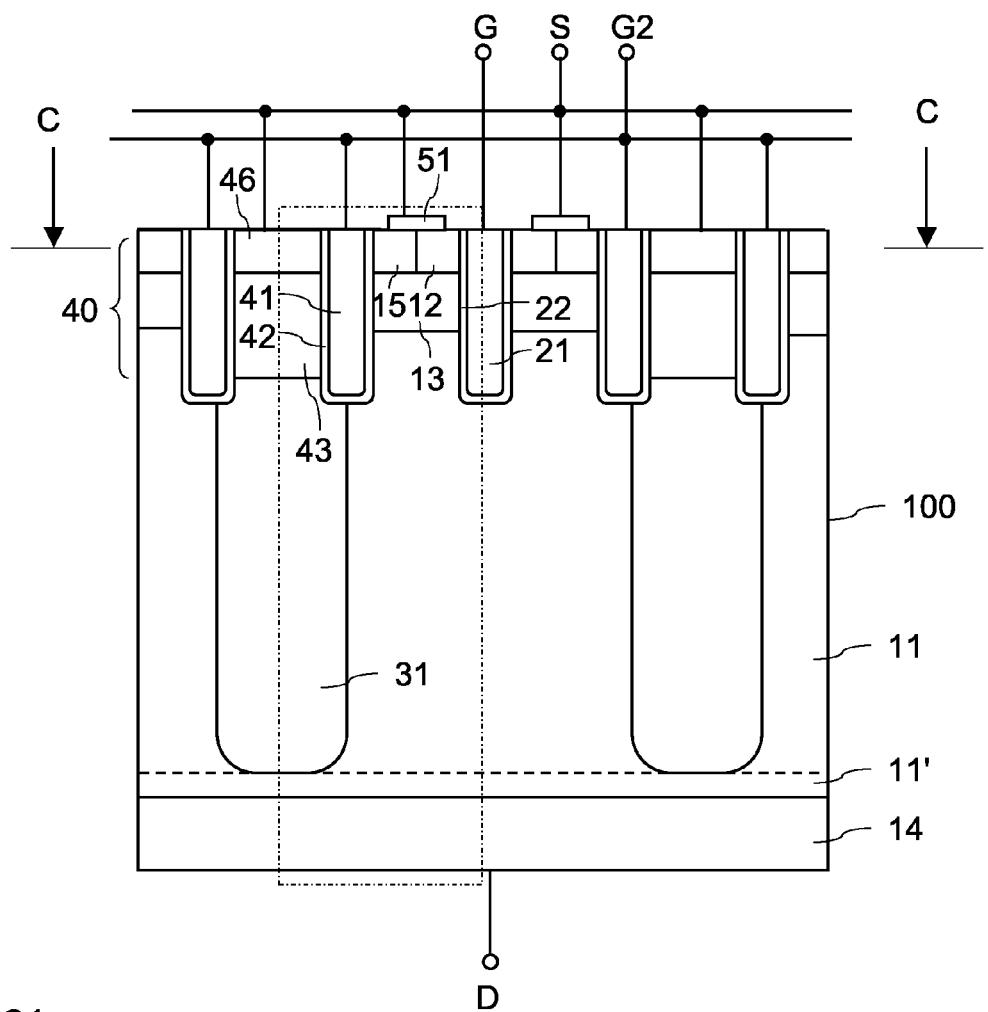
FIG. 24 illustrates a vertical cross sectional view of a MOSFET including a coupling arrangement with a JFET between a compensation region and a source electrode according to a first embodiment.

FIG. 24 illustrates a vertical cross sectional view of a section of a transistor device, specifically of a vertical MOSFET, that includes a plurality of device cells (transistor cells). In the present embodiment, each transistor cell includes a drain region 14, a drift region 11, a source region 12, and a body region 13 adjoining the source region 12 and separating the source region 12 from the drift region 11. One transistor cell is shown in dashed and dotted lines in FIG. 24 (the structure in dashed and dotted lines according to FIG. 24 could also be referred to as one half-cell). The individual transistor cells share the drift region 11 and the drain region 14. The drain region 14 may adjoin the drift region 11 (as illustrated). According to a further embodiment (not illustrated) a field-stop region of the same doping type as the drift region 11, but more highly doped may be arranged between the drift region 11 and the drain region 14. Each transistor cell further includes a gate electrode 21 that is adjacent the body region 13 and that is dielectrically insulated from the body region 13 by a gate dielectric 22. The gate electrode 21 is a trench electrode in the embodiment of FIG. 24, which is a gate electrode 21 arranged in a trench of the semiconductor body 100 and extending from the source region 12 into the drift region 11 in the vertical direction of the semiconductor body 100 along the body region 13. The gate electrodes 21 of the individual transistor cells are electrically connected to a gate terminal G (that is only schematically illustrated in FIG. 24).

In the semiconductor device of claim 24, like in each of the semiconductor devices explained before and explained in the following, the drift region 11, may include a drift region section 11' between the drain region 14 and the compensation region 31 that has a doping concentration that is different from the doping concentration of the drift region 11 between two neighboring compensation regions 31. According to one embodiment, the doping concentration in the drift region section 11' is lower than the doping concentration of the drift region 11 between neighboring compensation regions 31.

Referring to FIG. 24, each transistor cell further includes a compensation region 31. The compensation region 31 has a doping type complementary to the doping type of the drift region 11 and forms a pn-junction with the drift region 11. Two (or more) transistor cells may share one compensation region 31. This is illustrated in FIG. 24, where two neighboring transistor cells share one compensation region 31. Further, two or more transistor cells may share one gate electrode 21. In the embodiment of FIG. 24, two neighboring transistor cells share one gate electrode 21.

The source region 12 and the body region 13 of each transistor cell are connected to the source terminal S. A source electrode 51 that is electrically connected to the source region 12 and the body region 13 of one transistor cell is schematically illustrated in FIG. 24. Optionally, a contact region 15 of the same doping type as the body region 13, but more highly doped, is arranged between the body region 13 and the source electrode 51.

Referring to FIG. 24, a coupling arrangement 40 is connected between the compensation regions 31 and the source terminal S. Each coupling arrangement 40 includes a channel region 43 of the same doping type as the compensation region 31 and connected between the compensation region 31 and the source terminal S. Optionally, a contact region 46 of the same doping type as the channel region 43, but more highly doped than the channel region 43, is used to connect the channel region 43 to the source terminal S. The doping concentration of the channel region 43 is, e.g., between $1E14$ $cm^{-3}$ and $1E17$ $cm^{-3}$, while the doping concentration of the contact region 46 is, e.g., between $1E18$ $cm^{-3}$ and $1E21$ $cm^{-3}$. The control electrode 41 is adjacent the channel region 43 and is dielectrically insulated from the channel region 43 by the control electrode dielectric 42. In the present embodiment, the control electrode 41 includes at least two control electrode sections that are distant in a horizontal direction of the semiconductor body 100 and between which the channel region 41 is located. The coupling arrangement is arranged in a region of a surface of the semiconductor body 100, where the channel region 43 is electrically connected to the source terminal S at this surface. The compensation region 31 is located below the channel region 43 as seen from this surface. Further, in the embodiment of FIG. 24, the body region 13 is separated from the channel region 43 by the control electrode 41 and the control electrode dielectric 42, and the compensation region 31 is distant to the body region 13.

The control electrode 41, the control electrode dielectric 42, and the channel region 43 form a transistor, specifically a depletion transistor, that is connected between the compensation region 31 and the control terminal G2. This transistor is controlled through the control terminal G2 that is connected to the control electrode 41. Although the transistor of the coupling region is implemented as a depletion transistor in the embodiment of FIG. 24 and in further embodiments explained below, the transistor is not restricted to be implemented as a depletion transistor but could be implemented as any other type of transistor, such as an enhancement transistor, or a JFET (junction FET) as well.

This transistor, that will be referred to as coupling transistor in the following, can be operated as a switch that electrically isolates the compensation region 31 from the source terminal S (when the channel region 43 is depleted (pinched off) or that couples the compensation region 31 to the source terminal S, when the channel region 43 is not depleted (not pinched off). In an n-type MOSFET, the coupling transistor of the coupling arrangement 40 is a p-type transistor. This coupling transistor can be controlled by applying a control voltage referenced to the source terminal S to the control terminal G2.

The operating principle of the coupling transistor is explained below. Just for explanation purposes it is assumed that the transistor is a p-type depletion transistor. The coupling transistor has a threshold voltage, which is the voltage at which the coupling transistor starts to conduct when applied between the control terminal G2 and the source terminal S. The threshold voltage of a p-type depletion transistor is a positive voltage, where the transistor conducts when the control voltage is below the threshold voltage.

The coupling transistor may be operated as a switch, that is either switched off or that is switched on with a low on-resistance. When the coupling transistor is switched off, the compensation region 31 is floating, while the compensation region is connected to the source terminal when the coupling transistor is switched on. A p-type depletion transistor can be switched off by applying a control voltage (off-voltage) higher than the threshold voltage, and can be switched on with a low-on resistance by applying a control voltage (on-voltage) that is significantly below the threshold voltage and that operates the transistor in the saturation region. According to one embodiment, the off-voltage is zero. The threshold voltage of the coupling transistor can be adjusted through the doping concentration of the channel region 43, the width of the channel region 43 and a thickness of the control electrode dielectric 42. The width of the channel region 43 corresponds to the distance between the opposing sections of the control electrode 41. The threshold voltage increases when the doping concentration increases, and the threshold voltage increases when the width of the channel region 43 increases. The threshold voltage is, e.g., a voltage between 5V and 15V.

According to a further embodiment, the transistor of the coupling arrangement is not operated as a switch, but is operated as a variable resistor in the way explained with reference to FIG. 23. The coupling transistor can be operated as a variable resistor by applying a control voltage that is between the on-voltage and the off-voltage, where the electrical resistance increases as the control voltage approaches the threshold voltage.

Figure 25:
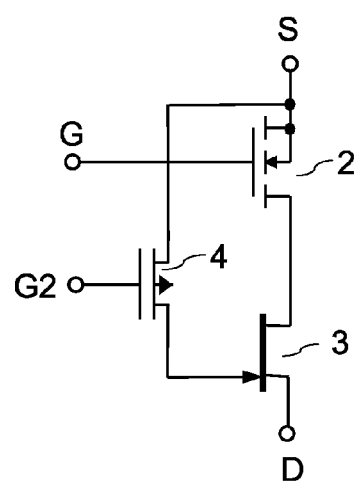
FIG. 25 illustrates the equivalent circuit diagram of the MOSFET of FIG. 24.

FIG. 25 shows the equivalent circuit diagram of one transistor cell of the transistor device of FIG. 24. This equivalent circuit diagram includes an enhancement MOSFET 2. Referring to FIG. 24, this enhancement MOSFET is formed by the gate electrode 21, the gate dielectric 22, the source region 12, the body region 13 and the section of the drift region 11 adjoining the body region 13. A JFET 3 is connected in series with the drain-source path of the enhancement MOSFET 2. This JFET 3 is formed by the drift region 11, the compensation region 31 and the drain region 14, where the compensation region 31 forms a gate region of the JFET 3. The enhancement MOSFET 2 and the first JFET 3 are connected in series between load terminals of the transistor device, which are the source and drain terminals S, D in the embodiment of FIG. 24. Referring to FIG. 25, a depletion transistor, in particular a depletion MOSFET, is connected between the source terminal S and the gate of the JFET 3. This depletion transistor is the coupling transistor of the coupling arrangement and is formed by the control electrode 41, the control electrode dielectric 42 and the channel region 43. The gate of this depletion transistor 4 is connected to the control terminal G2. This depletion transistor is a p-type depletion transistor in the embodiment of FIG. 25.

Referring to FIG. 24, a plurality of transistor cells (with each transistor cell having an equivalent circuit diagram according to FIG. 25) may be implemented in the transistor device. According to one embodiment, the coupling transistors connected between the compensation regions 31 and the source terminal S have the same threshold voltage. According to a further embodiment, there are at least two different groups of compensation regions 31 where the coupling transistors that couple the compensation regions of one group to the source terminal S have a threshold voltage that is different from the threshold voltage of the depletion transistors that couple the compensation regions 31 of the other group to the source terminal S. The operating principle of a transistor device implemented in this way is similar to the operating principle of the transistor device of FIG. 22, with the difference that the transistor device according to FIG. 24 requires only one control voltage, where the individual coupling transistors are switched on or switched off dependent on whether the control voltage is below or above the threshold voltage of the individual coupling transistors. Like in the transistor device of FIG. 22, the transistor device of FIG. 24 may optionally include conventional transistor cells that have their compensation region permanently coupled to one of the source and gate terminal.

According to yet another embodiment, the coupling transistors of the individual transistor cells have the same threshold voltage, and at least two control terminals for applying different control voltages are provided. The operating principle of a transistor device implemented in this way corresponds to the operating principle of the transistor device of FIG. 21.

Figure 26:
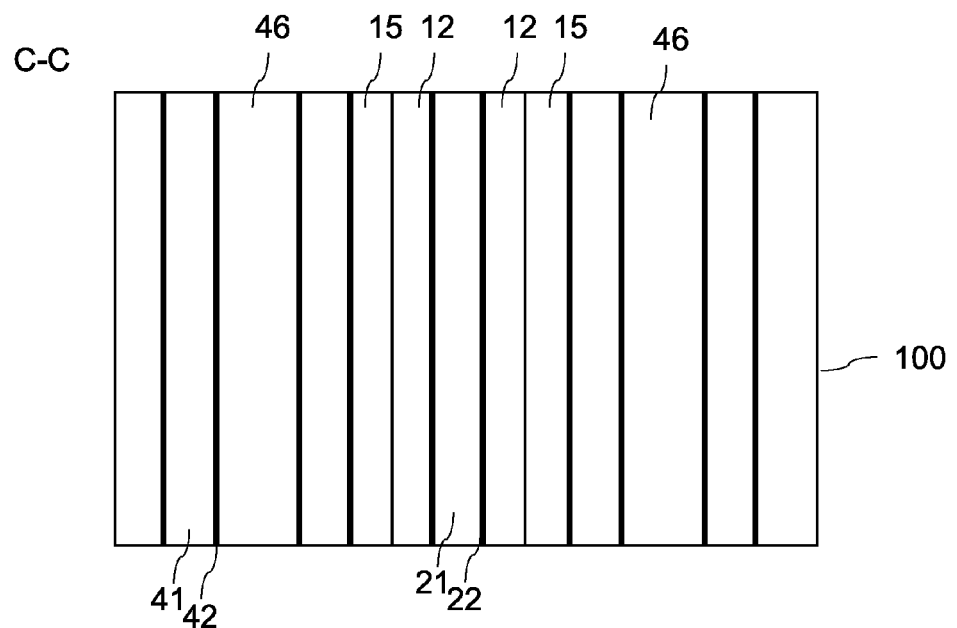
FIG. 26 illustrates a horizontal cross sectional view of the MOSFET of FIG. 24 according to a first embodiment.
Figure 27:
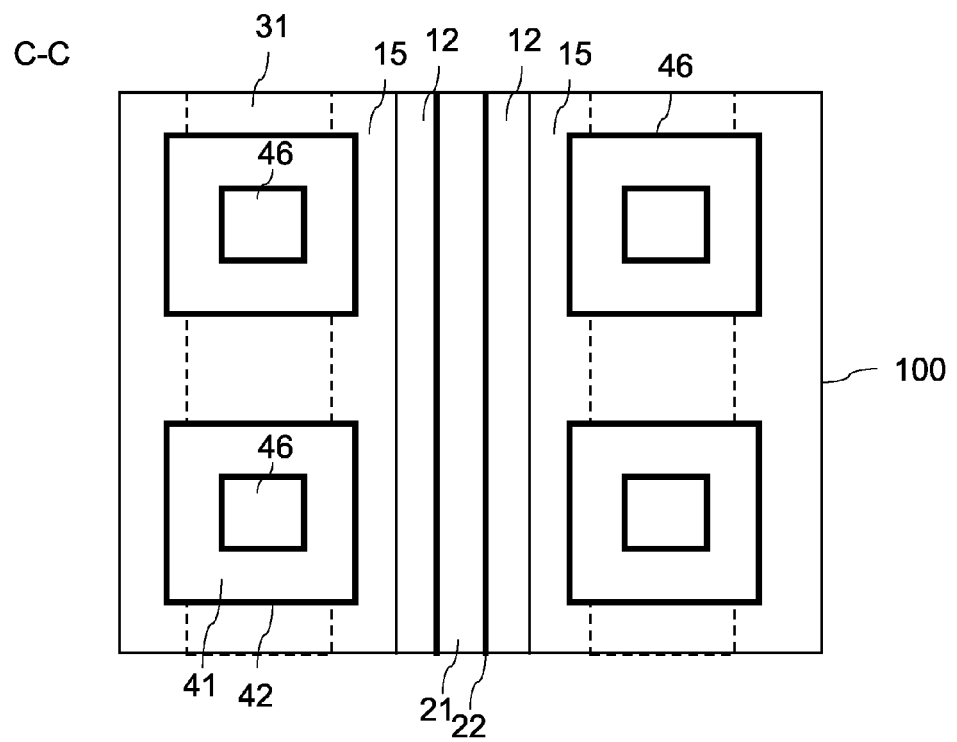
FIG. 27 illustrates a horizontal cross sectional view of the MOSFET of FIG. 24 according to a second embodiment.

FIGS. 26 and 27 illustrate horizontal cross sectional views of two different embodiments of the transistor device of FIG. 24. In each embodiment, the transistor cells are elongated transistor cells with elongated source regions 12 and with an elongated gate electrode 21. In the embodiment illustrated in FIG. 26, the control electrode sections 41 of the individual coupling transistors are elongated electrodes. Consequently, the channel region 46 is also an elongated semiconductor region that is essentially parallel to the source region 12. Compensation region 31 (that is out of view in FIG. 26) is also an elongated semiconductor region in this embodiment.

In the embodiment of FIG. 27, the compensation region 31 (that is illustrated in dashed lines in FIG. 27) is an elongated semiconductor region. However, one compensation region 31 is coupled to the source terminal S through several coupling transistors, with each coupling transistor having a ring-shaped control electrode 41, with each control electrode 41 surrounding one channel region 46. The specific form of the ring of the control electrode is arbitrary.

Figure 28:
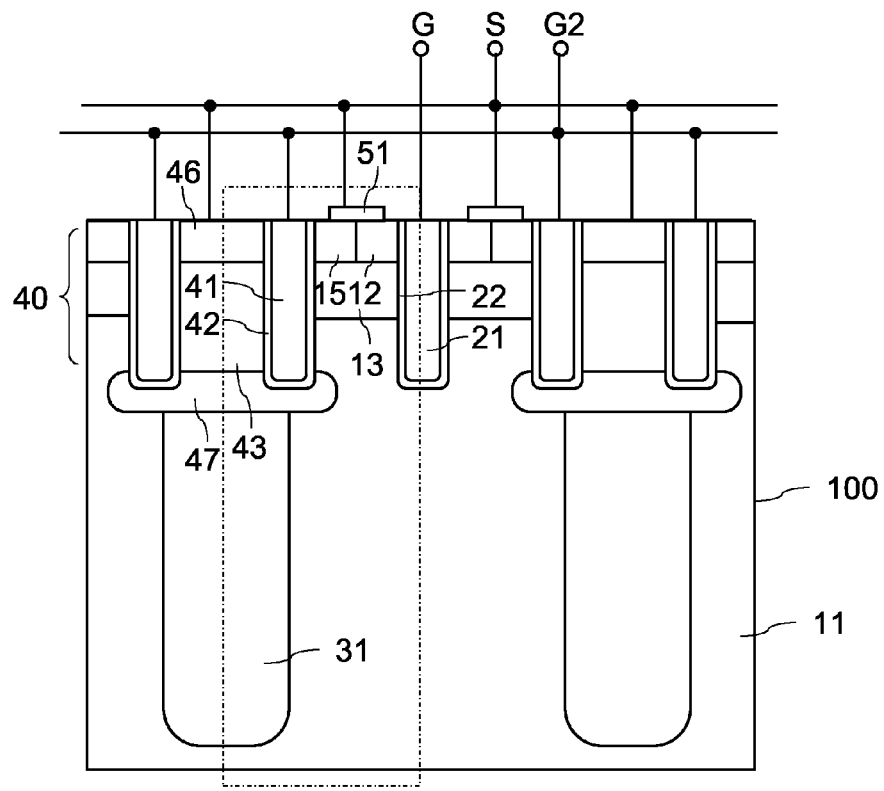
FIG. 28 illustrates a modification of the MOSFET of FIG. 24.

FIG. 28 illustrates a modification of the transistor device of FIG. 24. In the embodiment of FIG. 28, the channel region 43 is electrically connected to the compensation region 31 through a connection region 47 that has the same doping type as the channel region 43 and the compensation regions 31, but a higher doping concentration. The doping concentration of the connection region 47 is, e.g., about $1E17\ cm^{-3}$. In FIG. 28, as well as in other cross sectional views explained below, the drain region of the transistor device is not illustrated.

Figure 29:
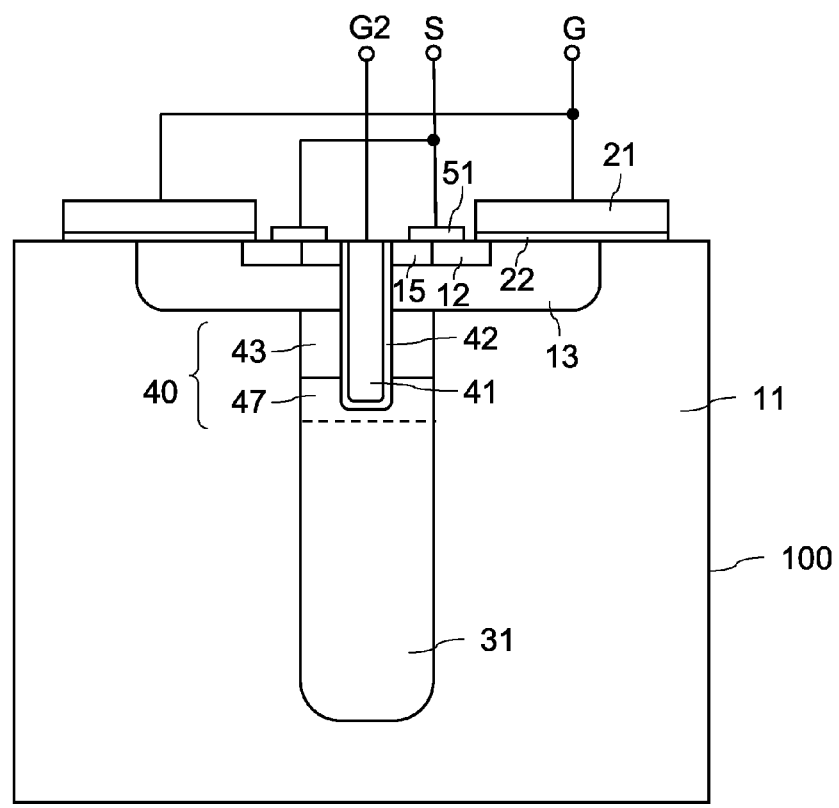
FIG. 29 illustrates a vertical cross sectional view of a MOSFET including a coupling arrangement with a JFET between a compensation region and a source electrode according to a second embodiment.

FIG. 29 illustrates a further embodiment of a transistor device that includes a coupling arrangement with a coupling transistor. In this embodiment, the coupling arrangement 40 is connected between the body region 13 and the compensation region 31, where the compensation region 31 is arranged below the body region 13 in the vertical direction of the semiconductor body. One end of the channel region 43 adjoins the body region 13, while an opposite end of the channel region 43 adjoins the compensation region 31 or an optional connection region 47. The optional connection region 47 has the same doping type as the compensation region 31 and the channel region 43, that has a higher doping concentration.

Referring to FIG. 29, the control electrode 41 of the coupling transistor is implemented as a trench electrode that extends from the surface of the semiconductor body 100 through the body region 13 and the channel region 43 to or into the compensation region 31 or the optional connection region 47, respectively. The control electrode 41 is dielectrically insulated from these semiconductor regions by the control electrode dielectric 42.

In the embodiment of FIG. 29, the gate electrode 21 (of the enhancement MOSFET) is implemented as a planar electrode above the surface of the semiconductor body 100 and extends in a lateral direction of the semiconductor body 100 from the source region 12 along the body region 13 to the drift region 11 and is dielectrically insulated from these semiconductor regions by the gate dielectric 22. A section of the drift region 11 extends to the surface of the semiconductor body 100 in this embodiment.

The operating principle of the transistor device of FIG. 29 corresponds to the operating principles of the transistor devices of FIGS. 24 and 28. That is, the coupling arrangement 40 with the coupling transistor provides a switch or provides a variable resistor between the source terminal S, that is electrically connected to the body region 13 through the contact region 15, and the compensation region 31, where the resistance of this variable resistor can be adjusted through a control voltage applied between the control terminal G2 and the source terminal S. When the magnitude of the control voltage is higher than the threshold voltage of the depletion transistor, the compensation region 31 is floating (electrically isolated from the body region 13). At control voltages below the threshold voltage, the depletion transistor acts as a resistor as explained with reference to FIGS. 23 and 24.

Figure 30:
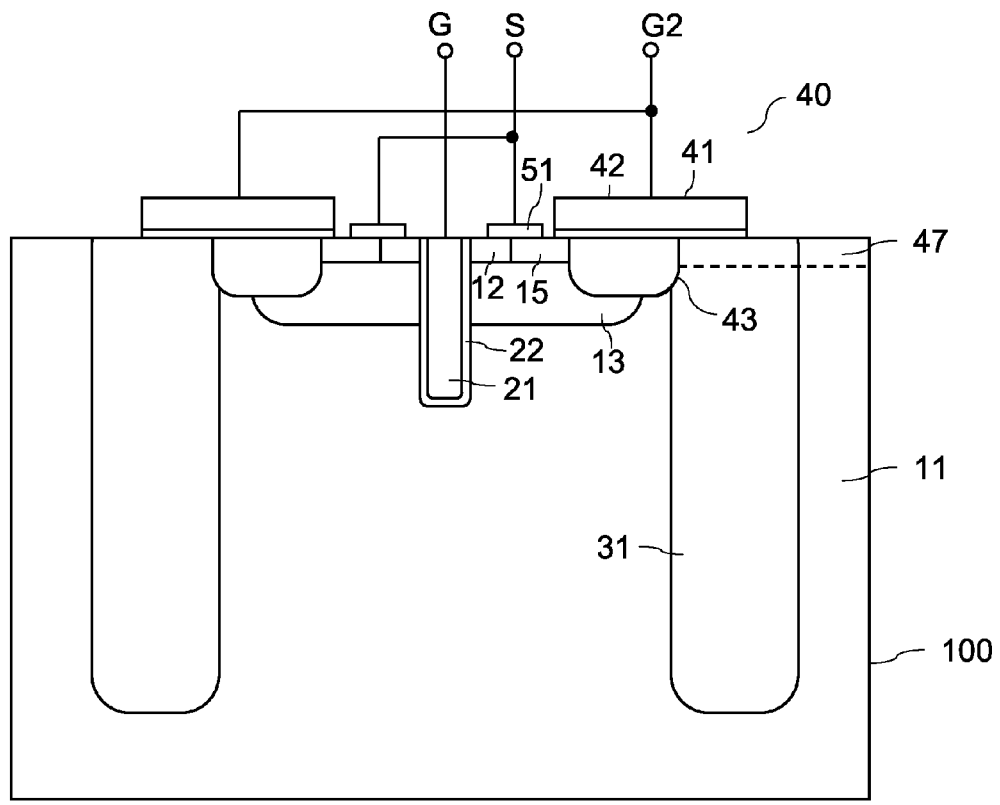
FIG. 30 illustrates a vertical cross sectional view of a MOSFET including a coupling arrangement with a JFET between a compensation region and a source electrode according to a third embodiment.

FIG. 30 illustrates a further embodiment of a transistor device with a coupling arrangement 40 that includes a coupling transistor. In this embodiment, the gate electrode 21 is implemented as a trench electrode that extends from the surface of the semiconductor body 100 through the source region 12 and the body region 13 to or into the drift region 11. The compensation region 31 is distant to the gate electrode 21 in the lateral direction of the semiconductor body 100. The control electrode 41 of the coupling arrangement 40 is implemented as a planar electrode above the surface of the semiconductor body 100 and, in a lateral direction of the semiconductor body 100 extends from the contact region 15 along the channel region 43 to the compensation region 31. Optionally, a connection region 47 of the same doping type as the channel region 43, but more highly doped, adjoins the channel region 43 in the region of the surface of the semiconductor body 100. Like in the embodiments explained before, the body region 13 is distant to the compensation region 31.

Figure 31:
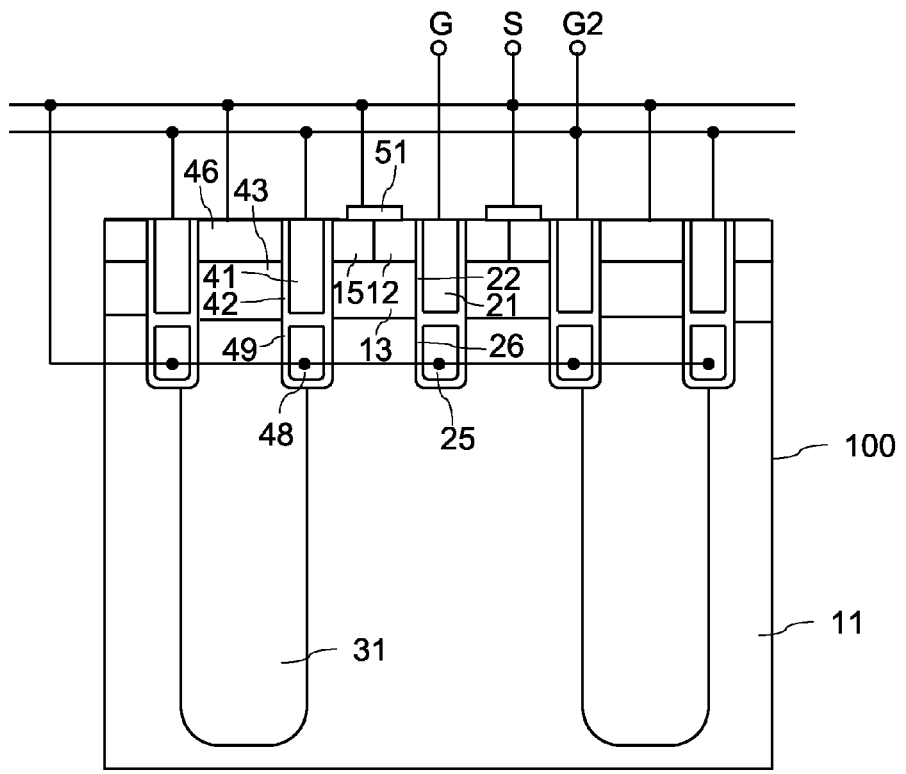
FIG. 31 illustrates a vertical cross sectional view of a MOSFET including a coupling arrangement with a JFET between a compensation region and a source electrode according to a fourth embodiment.

FIG. 31 illustrates a further embodiment of a transistor device. The transistor device of FIG. 31 is based on the transistor device of FIG. 24 and is different from the transistor device of FIG. 24 in that field electrodes 25, 48 that are electrically connected to the source terminal S are located below the gate electrode 21 and the control electrode 41, respectively. The field electrodes 25, 48 are dielectrically insulated from the surrounding semiconductor regions by field electrode dielectrics 26, 49. The field electrode 26 below the gate electrode 21 is adjacent the drift region 11, while the field electrode 48 below the control electrode 41 is adjacent the compensation region 31 on one side and adjacent the drift region 11 on the other side. The field electrodes 25, 48 have a shielding function and protect the gate dielectric 22 and the control electrode dielectric 42 from dielectric fields when the transistor device is in the off-state. The connection between the field electrodes 25, 48 and the source terminal S is only schematically illustrated in FIG. 31.

Referring to the explanation provided with reference to FIG. 24, the coupling transistor of the coupling arrangement 40 can be operated as a variable resistor that does not completely pinch-off the electrical connection between the compensation region 31 and the source terminal S. The effect of providing a variable resistor between the compensation regions 31 and the source terminal S has been explained with reference to FIG. 23. Referring to this description, the rate at which the compensation region 31 is discharged when the transistor device switches from the off-state to the on-state can be adjusted through the control voltage applied to the control terminal G2. When the variable resistor is adjusted to have a high resistance value, such as, when the coupling transistor pinches the channel region 43 completely off, the compensation region 31 cannot be discharged when the transistor device switches on. When, however, the channel region between the compensation region 31 and the source terminal S is not completely pinched off (which is when the control voltage is below the threshold voltage of the coupling transistor) the compensation region 31 is discharged when the MOSFET switches on, where the dynamic of the discharging process is defined by the resistance value of the variable resistor (that may be implemented as a depletion transistor). In this case, the variable resistor defines the amount of charge that may be flow from the compensation region to the source terminal within a predefined time period, where a charge flows to the compensation region 31 until the compensation region 31 is completely discharged.

Figure 32:
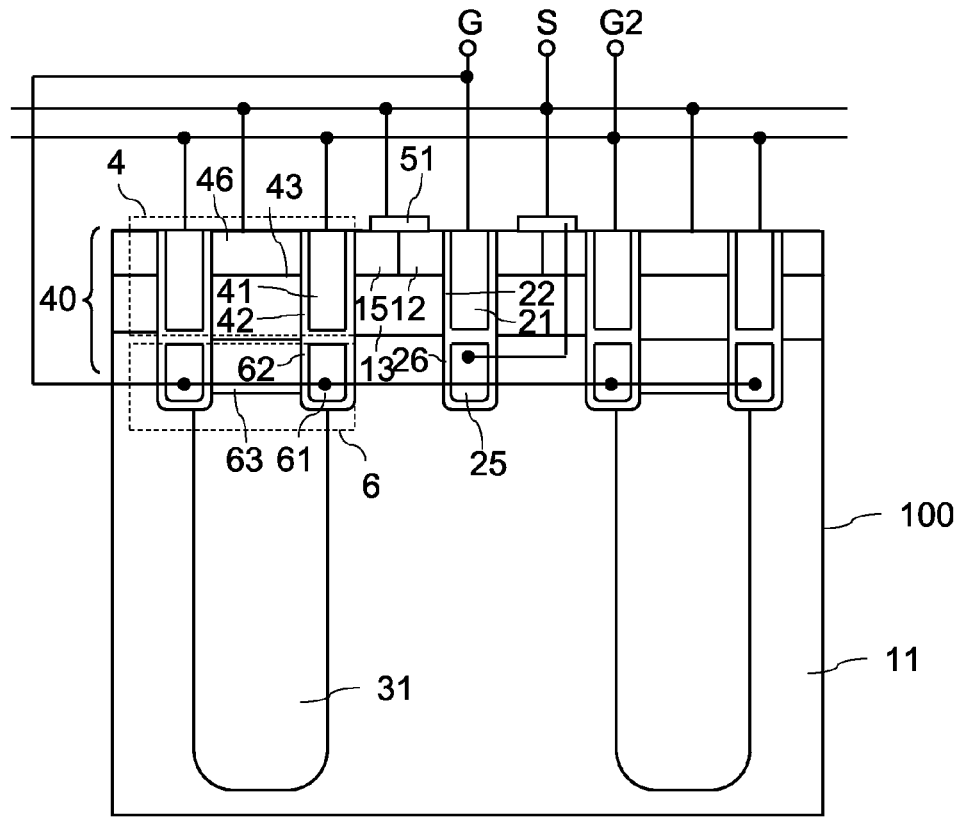
FIG. 32 illustrates a vertical cross sectional view of a MOSFET including a coupling arrangement with two series connected JFETs between a compensation region and a source electrode according to a first embodiment.

FIG. 32 illustrates a further embodiment of a transistor device. In this transistor device not only the amount of charge that may flow to the compensation region 31 within a predefined time period after the transistor device has been switched on, but also the overall amount of charge flowing from the compensation region 31 can be controlled. Controlling the charge that flows from the compensation region 31 after the transistor device has been switched on, allows to adjust the output capacitance and, consequently, the on-resistance of the transistor device. While in the embodiments explained before the compensation region 31 is either left floating (resulting in a low output capacitance but a high on-resistance) or is discharged (where the rate at which the compensation region 32 is discharged may vary), the compensation region 31 of the transistor device of FIG. 32 can be partly discharged. Thus, it is possible to continuously vary the output capacitance and the on-resistance of the transistor device. The amount of charge that flows from the compensation region 31 after the transistor device has been switched on is controlled in the coupling arrangement through two coupling transistors, namely the coupling transistor explained before (that will be referred to as first coupling transistor in the following), and a second coupling transistor.

In the embodiment of FIG. 32, the first coupling transistor is implemented as a depletion transistor. The embodiment of FIG. 32 is based on the embodiment of FIG. 24 so that everything that has been explained with reference to the individual features of the transistor device of FIG. 24 applies to the transistor device of FIG. 32 accordingly. Like in the transistor device of FIG. 24, the transistor device of FIG. 32 may be implemented with first coupling transistors having identical threshold voltage, with first coupling transistors having different threshold voltages, and with one or with several control terminals G2.

In the embodiment of FIG. 32, the second coupling transistor is also implemented as a depletion transistor and includes a second control electrode 61 that is adjacent a second channel region 63 and that is dielectrically insulated from the second channel region 63 by a second control electrode dielectric 62. The second channel region 63 adjoins the channel region 43 (which will be referred to as first channel region in the following). In the embodiment of FIG. 32, the second control electrode 61 is below the first control electrode 41 in the vertical direction of the semiconductor body 100 and is dielectrically insulated from the first control electrode 41 by a dielectric layer. The first channel region 43 is connected to the source terminal S, either directly or through the optional contact region 46, and the second channel region 63 is connected between the first channel region 43 and the compensation region 31. However, the order of having the first and second channel regions 43, 63 connected between the source terminal S and the compensation region 31 could be changed as will be explained herein further below. The first and second coupling transistors may be transistors of the same type. However, these coupling transistors could also be implemented as transistors of different types.

In the embodiment of FIG. 32, the transistor device further includes a field electrode 25 coupled to the source terminal S and located below the gate electrode 21. However, this field electrode 25 is optional.

Figure 33:
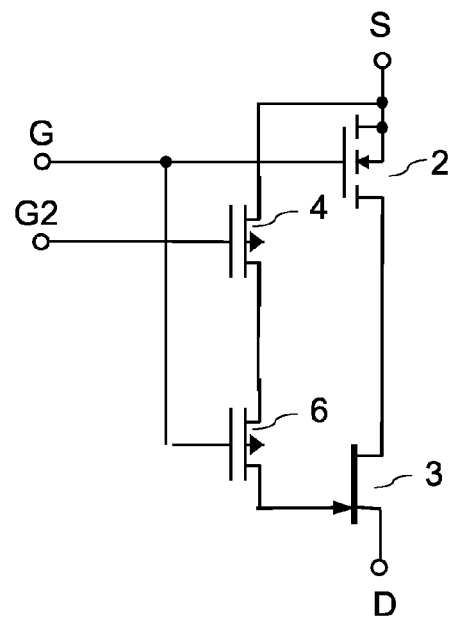
FIG. 33 illustrates the equivalent circuit diagram of the MOSFET of FIG. 32.

FIG. 33 shows the equivalent circuit diagram of one transistor cell of the transistor device of FIG. 32. The equivalent circuit diagram of FIG. 33 is based on the equivalent circuit diagram of FIG. 25 and additionally includes a second coupling transistor 6 connected in series with the first coupling transistor 4 between the source terminal S and the gate region of the JFET 3. The second coupling transistor 6 is also implemented as a depletion transistor, specifically as a p-type depletion transistor. Referring to FIG. 32, this second coupling transistor 6 is formed by the second control electrode 61, the second control electrode dielectric 62 and the second channel region 63.

The doping concentration of the second channel region 63 may correspond to the doping concentration of the first channel region 43, or may be different from the doping concentration of this channel region 43. The threshold voltage of the second coupling transistor can be adjusted through the doping concentration of the second channel region 63 and/or the distance between the at least two opposing sections of the second control electrode 61 between which the second control region 63 is arranged and/or a thickness of the dielectric layer 62.

The operating principle of the transistor device of FIGS. 32 and 33 is explained below. For explanation purposes it is assumed that the transistor device is in the off-state, so that the compensation region 31 has been charged. When the transistor device is switched on by applying a suitable drive voltage between the gate terminal G and the source terminal S, the control voltage between the control terminal G2 and the source terminal S defines the resistance of the first coupling transistor and, therefore, defines the amount of charge that may flow between the compensation regions 31 in the source terminal S within a pre-defined time period. The second coupling transistor 6 defines the duration of the time period for which charge can be transferred between the compensation region 31 and the source terminal S. This second coupling transistor 6 is controlled through the gate terminal G and switches off, when the voltage between the gate terminal G and the source terminal S reaches the threshold voltage of the fourth transistor 6. The threshold voltage of the fourth transistor 6 is adjusted such that it is lower than the voltage finally applied between the gate terminal G and the source terminal S when the transistor device is in the on-state. The voltage (gate-source voltage) that is applied between the gate terminal G and the source terminal S in the on-state of the transistor device is, for example, between 5V and 20V, in particular between 10V and 15V. The threshold voltage of the second coupling transistor of the coupling arrangement 40 is lower than this voltage. When the transistor device is to be switched on, the gate-source voltage is increased from an off-value to an on-value. The off-value is, for example, 0V in an n-type transistor device, and the on-value corresponds to the final value explained before. When the gate-source voltage increases, the second transistor of the coupling arrangement is switched on until the gate-source voltage reaches the threshold value of this second coupling transistor. In the time period before the second coupling transistor pinches off, the compensation region 31 can be discharged, where the amount of charge that flows from the compensation region 31 to the source terminal S within a pre-defined time period is defined by the first coupling transistor of the coupling arrangement 40. After the second transistor has been pinched off, the compensation region 31 is not discharged any further independent of the control voltage applied between the control terminal G2 and the source terminal S. Thus, the amount of charge that remains in the compensation region after the transistor device has been switched on, can be controlled through the first and second coupling transistors in this embodiment.

Figure 34:
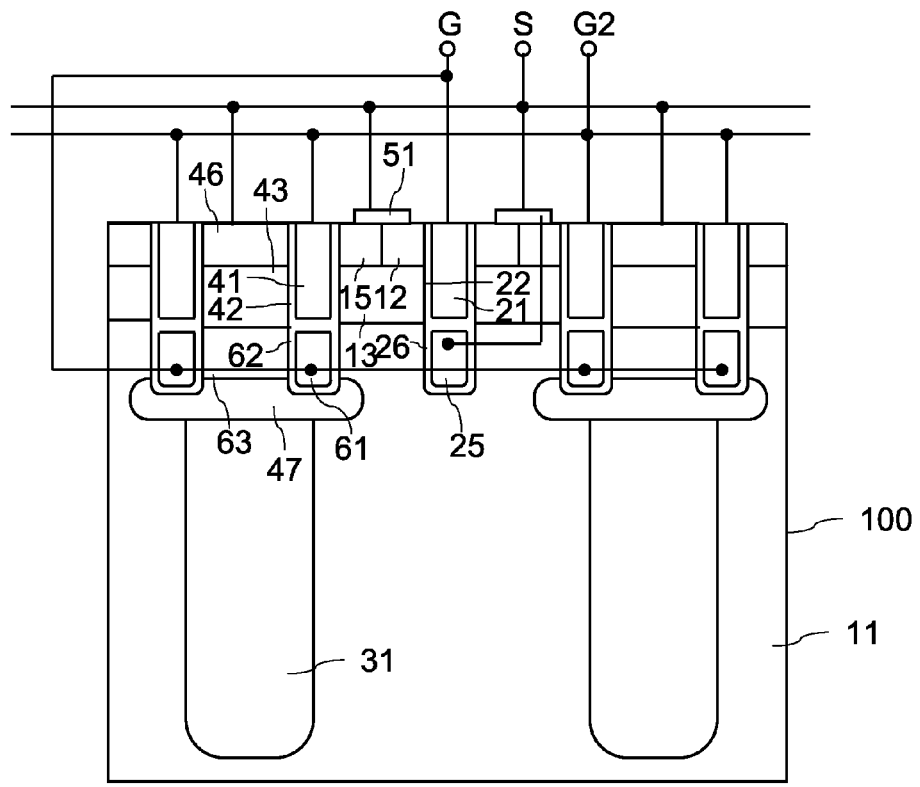
FIG. 34 illustrates a modification of the MOSFET of FIG. 24.

FIG. 34 illustrates a vertical cross sectional view of a transistor device according to a further embodiment. The transistor device of FIG. 34 is based on the transistor device of FIG. 32 and additionally includes a connection region 47 between the second channel region 63 and the compensation region 31. This connection region 47 has the same doping type as the compensation region 31 and the first and second channel regions 43, 63 but is more highly doped.

Figure 35:
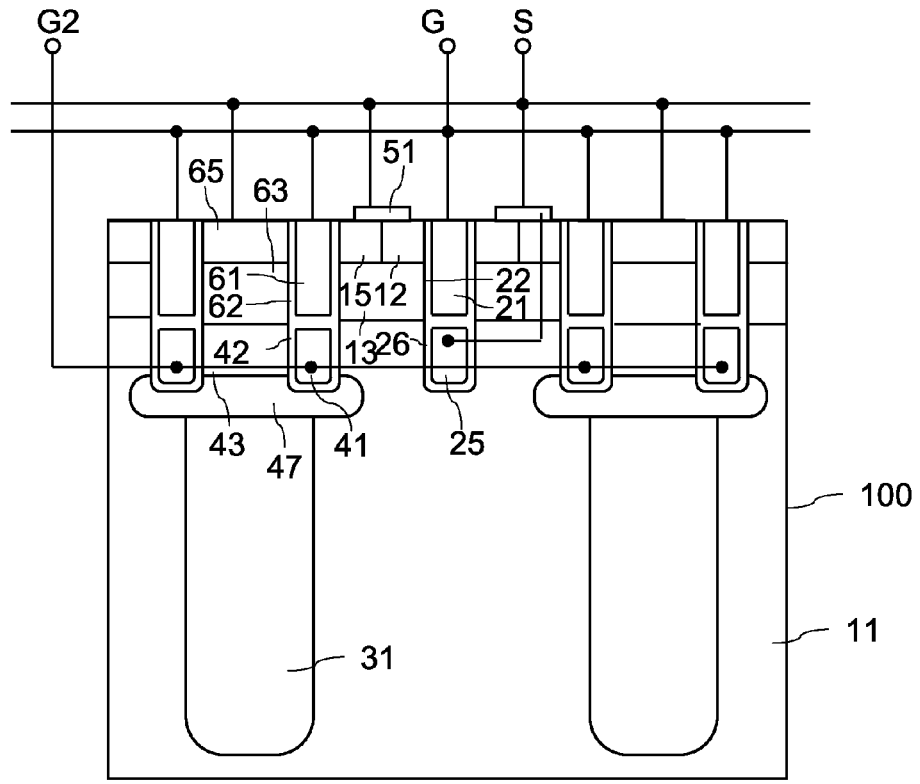
FIG. 35 illustrates a vertical cross sectional view of a MOSFET including a coupling arrangement with two series connected JFETs between a compensation region and a source electrode according to a second embodiment.

FIG. 35 illustrates a vertical cross sectional view of a transistor device according to a further embodiment. In this embodiment, the first channel region 43 is arranged between the second channel region 63 and the compensation region 31. The channel region 63 is connected to the source terminal S, either directly or through an optional contact region 65 of the same doping type as the second channel region 63, but more highly doped. The connection region 47 between the first channel region 43 and the compensation region 31 is optional.

Figure 36:
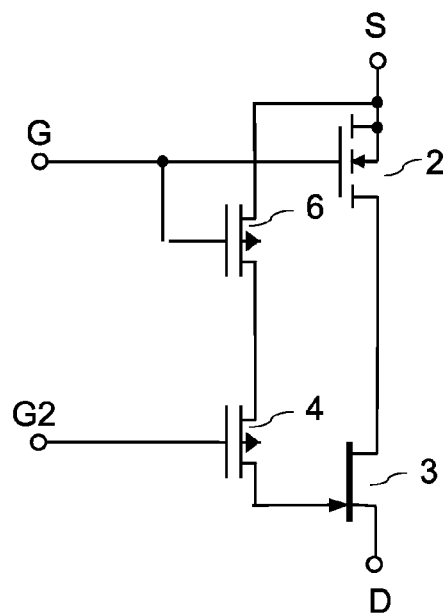
FIG. 36 illustrates the equivalent circuit diagram of the MOSFET of FIG. 35.

The equivalent circuit diagram of one transistor cell of the transistor device of FIG. 35 is illustrated in FIG. 36. This equivalent circuit diagram corresponds to the equivalent circuit diagram of FIG. 33 with the difference that the order of the first and second coupling transistors 4, 6 in the series circuit with the two coupling transistors between the source terminal S and the gate region (the compensation region 31) of the JFET 3 is interchanged.

Figure 37:
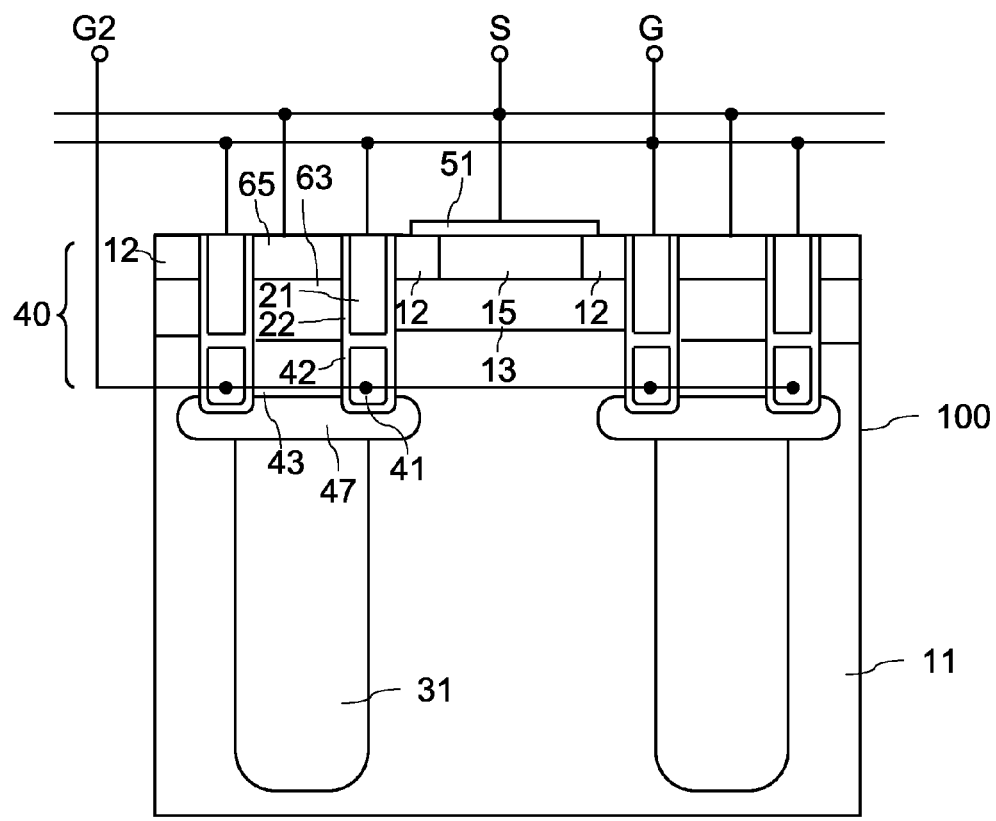
FIG. 37 illustrates a vertical cross sectional view of a MOSFET including a coupling arrangement with two JFETs between a compensation region and a source electrode according to a first embodiment.

FIG. 37 illustrates a further embodiment of a transistor device. In this embodiment, the gate electrode 21 is implemented as a trench electrode and is adjacent the body region 13 on one side of the trench and is adjacent the second channel region 36 on the other side of the trench. Thus, the gate electrode 21 simultaneously acts as the gate electrode of the MOSFET and as the second control electrode of the second coupling transistor of the coupling arrangement 40. The first control electrode 41 is located below the gate electrode 21 and adjacent the first channel region 43. The first channel region 43 adjoins the second channel region 63 and is connected to the compensation region 31 either directly or through the optional connection region 47. Like in the embodiments explained with reference to FIGS. 32, 34 and 35, the compensation region 31 is distant to the surface of the semiconductor body 100.

Figure 38:
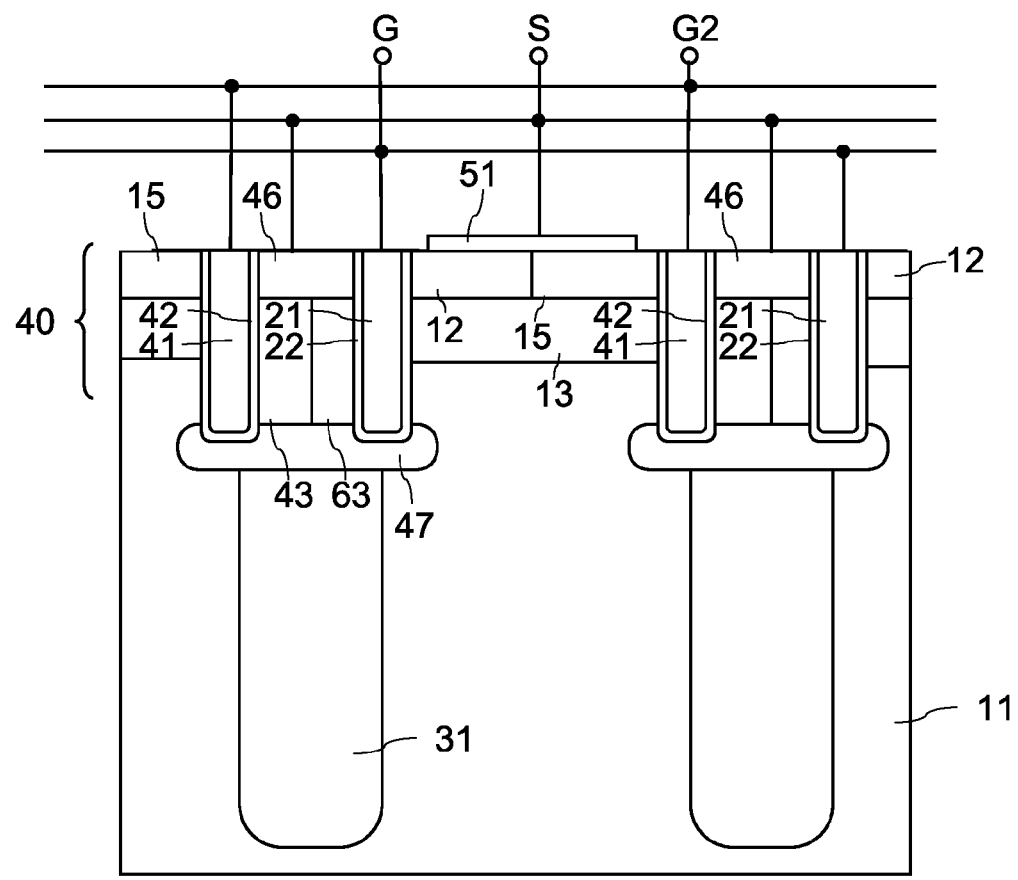
FIG. 38 illustrates a vertical cross sectional view of a MOSFET including a coupling arrangement with two JFETs between a compensation region and a source electrode according to a second embodiment.

FIG. 38 illustrates a further embodiment of a transistor device with a coupling arrangement 40 including two transistors. In this embodiment, the gate electrode 21, like in the embodiment of FIG. 37 forms the gate electrode of the MOSFET and the second control electrode of the second transistor of the coupling arrangement. The gate electrode 21 and the control electrode 41 of the first transistor of the coupling arrangement 40 are distant in the lateral direction of the semiconductor body 100 and are each implemented as trench electrodes. The gate electrode 21 is adjacent the body region 13 on one side of the trench and is adjacent the second channel region 63 on the other side of the trench. The second channel region 63 adjoins the first channel region 43 in the lateral direction of the semiconductor body 100. The first and second channel regions 43, 63 are both connected between the source terminal S and the compensation region 31, where connection regions 46 and 47 between the channel regions 43, 63 and the source terminal and between the channel regions 43, 63 and the compensation region 31, respectively, are optional. In this semiconductor device, the control electrode 41 controls the channel in the first channel region 43, specifically the resistance of this channel, when the semiconductor device is in the off-state. The distance between the control electrode 41 and the gate electrode 21, the doping concentrations of the first and second channel regions 43, 63 and thicknesses of the dielectric layers 42, 22 are selected such that the gate electrode 21 pinches off the first and second channel regions 43, 63 when the semiconductor device is in the on-state.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising at least one device cell, the at least one device cell comprising:
a source region, a drain region, a body region and a drift region in a semiconductor body, wherein the body region is arranged between the source region and the drift region and the drift region is arranged between the body region and the drain region;
a compensation region adjoining the drift region;
a source electrode electrically contacting the source region and the body region;
a gate electrode arranged adjacent to the body region and dielectrically insulated from the body region by a gate dielectric; and
a coupling arrangement comprising a control terminal and being configured to electrically couple the compensation region to at least one of the body region, the source region and the source electrode dependent on a control signal received at the control terminal,
wherein the coupling arrangement further comprises at least one first coupling transistor having a first channel region coupled between the compensation region and the least one of the body region, the source region, the source electrode and the gate electrode, and having a first control electrode coupled to the control terminal.

2. The semiconductor device of claim 1, wherein the coupling arrangement further comprises an electronic switch connected between the compensation region and the source electrode.

3. The semiconductor device of claim 1, wherein the coupling arrangement further comprises:
a control electrode electrically connected to the control terminal and extending between the body region and the compensation region through a section of the drift region; and
a control electrode dielectric dielectrically insulating the control electrode from the drift region, the body region and the compensation region.

4. The semiconductor device of claim 1, wherein the coupling arrangement is configured to adjust or control a current between the compensation region and at least one of the body region, the source region, the source electrode and the gate electrode.

5. The semiconductor device of claim 1, wherein the coupling arrangement further comprises a variable resistor.

6. The semiconductor device of claim 1, wherein the coupling arrangement is configured to limit a current between the compensation region and the at least one of the body region, the source region and the source electrode dependent on the control signal.

7. The semiconductor device of claim 1, further comprising a plurality of device cells having a common drift region, a common drain region and gate electrodes connected to a common gate terminal.

8. The semiconductor device of claim 7, wherein the coupling arrangements of the plurality of device cells have their control terminals connected to a common control terminal.

9. The semiconductor device of claim 7, wherein the plurality of device cells is subdivided into p, with p≥2, groups of device cells, each group of device cells having a group control terminal and the device cells of each group having their control terminals connected to corresponding group control terminal.

10. The semiconductor device of claim 1, further comprising at least one further device cell, comprising:
a further source region, a further drain region, a further body region and a further drift region, wherein the further body region is arranged between the further source region and the further drift region and the further drift region is arranged between the further body region and the further drain region;
a further source electrode electrically contacting the source region and the body region;
a further gate electrode arranged adjacent to the body region and dielectrically insulated from the further body region by a further gate dielectric; and
a further compensation region arranged in the drift region and electrically connected to one of the further source region, the further body region, the further source electrode and the further gate electrode.

11. The semiconductor device of claim 10, wherein the at least one device cell and the at least one further device cell have the gate electrode and the further gate electrode connected to a common gate terminal.

12. The semiconductor device of claim 10, wherein the drift region of the at least one transistor cell and the further drift region of the at least one further transistor cell form a common drift region, and wherein the drain region of the at least one transistor cell and the further drain region of the at least one further transistor cell form a common drain region.

13. The semiconductor device of claim 1, wherein the at least one first coupling transistor is a depletion transistor.

14. The semiconductor device of claim 1, wherein the at least one first coupling transistor is a depletion MOSFET.

15. The semiconductor device of claim 1, wherein at least one of the gate electrode and the control electrode is a trench electrode extending in a vertical direction of the semiconductor body.

16. The semiconductor device of claim 1, wherein at least one of the gate electrode and the first control electrode is a planar electrode arranged above a surface of the semiconductor body.

17. The semiconductor device of claim 1, wherein the compensation region is adjacent the channel region in the vertical direction of the semiconductor body.

18. The semiconductor device of claim 17, wherein the first channel region is adjacent the body region in the vertical direction of the semiconductor body.

19. The semiconductor device of claim 17, wherein the first channel region is adjacent the body region in a lateral direction of the semiconductor body and is separated from the body region by the first control electrode.

20. The semiconductor device of claim 1, wherein the compensation region is adjacent the channel region in the lateral direction of the semiconductor body.

21. The semiconductor device of claim 1, wherein a plurality of first coupling transistors are coupled between the compensation region and the least one of the body region, the source region, the source electrode and the gate electrode, and having a first control electrode coupled to the control terminal.

22. The semiconductor device of claim 1, further comprising at least one second coupling transistor having a second channel region coupled between the compensation region and the least one of the body region, the source region, the source electrode and the gate electrode, and having a second control electrode coupled to the gate electrode.

23. The semiconductor device of claim 22, wherein the at least one second coupling transistor is a depletion transistor.

24. The semiconductor device of claim 23, wherein the at least one second coupling transistor is a depletion MOSFET.

25. The semiconductor device of claim 22, wherein the channel regions of the first and second coupling transistors are arranged in series between the compensation region and the least one of the body region, the source region, the source electrode and the gate electrode.

26. The semiconductor device of claim 22, wherein one electrode forms the gate electrode and the second control electrode of the second coupling transistor.

27. The semiconductor device of claim 1, further comprising a plurality of transistor cells connected in parallel.

28. The semiconductor device of claim 27, wherein the first coupling transistors of at least two different transistor cells have different threshold voltages.

* * * * *